United States Patent
Quipuempoix et al.

(10) Patent No.: US 10,615,821 B2
(45) Date of Patent: Apr. 7, 2020

(54) CHARGE-BASED DIGITAL TO ANALOG CONVERTER WITH SECOND ORDER DYNAMIC WEIGHTED ALGORITHM

(71) Applicant: Microchip Technology Incorporated, Chandler, AZ (US)

(72) Inventors: Vincent Quipuempoix, Divonne les bains (FR); Eve Carletti, Morges (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/394,392

(22) Filed: Apr. 25, 2019

(65) Prior Publication Data
US 2019/0334545 A1    Oct. 31, 2019

Related U.S. Application Data

(60) Provisional application No. 62/664,511, filed on Apr. 30, 2018.

(51) Int. Cl.
*H03M 1/66* (2006.01)
*H03M 3/00* (2006.01)
(Continued)

(52) U.S. Cl.
CPC .......... *H03M 3/464* (2013.01); *H03M 3/434* (2013.01); *H03M 3/438* (2013.01); *H03M 3/456* (2013.01);
(Continued)

(58) Field of Classification Search
CPC ............ H03M 1/00; H03M 3/30; H03M 1/66; H03M 1/06
(Continued)

(56) References Cited

U.S. PATENT DOCUMENTS 6,266,002 B1 *  7/2001  Gong .................. H03M 1/0668
                                                    341/143
7,102,558 B2    9/2006  Deval .......................... 341/150
(Continued)

FOREIGN PATENT DOCUMENTS

EP            2237424 A1    10/2010    .............. H03M 1/06

OTHER PUBLICATIONS

International Search Report and Written Opinion, Application No. PCT/US2019/029571, 14 pages, dated Jul. 29, 2019.

*Primary Examiner* — Joseph J Lauture
(74) *Attorney, Agent, or Firm* — Slayden Grubert Beard PLLC

(57) ABSTRACT

A method includes receiving samples of digital to analog converter (DAC), partitioning the samples to unit-DACs based upon previous partitions of inputs to the unit-DACs to cancel out integrated non-linearities of outputs of the DAC caused by the gain mismatches of the unit-DACs, including partitioning samples of DAC input to the unit-DACs through a recursive nth order partitioning algorithm. The algorithm includes, for each DAC input, determining a first partition of the DAC input that would cancel an (n−1)th order previously integrated non-linearity, adding an equivalent DAC input of the first partition to the DAC input to obtain a total DAC input, using a first order application of the total DAC input to the inputs of the unit-DACs to yield a second partition of DAC input, summing the first and second partitions generate a final partition, and, based on the final partition, computing non-linearity remainders at each order of integration.

20 Claims, 17 Drawing Sheets

(51) Int. Cl.
*H03M 1/06* (2006.01)
*H03M 1/00* (2006.01)

(52) U.S. Cl.
CPC ............... *H03M 1/00* (2013.01); *H03M 1/06* (2013.01); *H03M 1/66* (2013.01); *H03M 3/30* (2013.01)

(58) Field of Classification Search
USPC .......................... 341/150, 143, 144, 145, 118
See application file for complete search history.

(56) References Cited

U.S. PATENT DOCUMENTS

| | | | |
|---|---|---|---|
| 7,994,958 B2 | 8/2011 | Quiquempoix et al. | 341/150 |
| 8,970,416 B2 | 3/2015 | Quiquempoix | 341/143 |
| 9,214,953 B1 | 12/2015 | Mengad | |
| 2002/0070887 A1 | 6/2002 | Brooks et al. | 341/144 |
| 2005/0285765 A1 | 12/2005 | Suzuki et al. | 341/143 |
| 2006/0192703 A1 | 8/2006 | Yen | 341/118 |

\* cited by examiner

BITSTREAM ARRAY {V1[k],...Vm[k]} :
EACH UNIT-DAC i IS ASSOCIATED WITH A CALCULATED Vi[k] INPUT
DETERMINED BY THE DWA ALGORITHM SO THAT ΣVi[k] = V[k]

| 602 → | V1[k] | V2[k] | ∘ ∘ ∘ | Vm[k] |
|---|---|---|---|---|
| | Cdac1 | Cdac2 | ∘ ∘ ∘ | Cdacm |

FIRST ORDER MEMORY STACK S1i[k] = S1i[k-1] + Vi[k]
(IF NO CANCELLATION OCCURS)

| 604 → | S11[k] | S12[k] | ∘ ∘ ∘ | S1m[k] |
|---|---|---|---|---|
| | Cdac1 | Cdac2 | ∘ ∘ ∘ | Cdacm |

SECOND ORDER MEMORY STACK S2i[k] = S2i[k-1] + S1i[k]
(IF NO CANCELLATION OCCURS)

| 606 → | S21[k] | S22[k] | ∘ ∘ ∘ | S2m[k] |
|---|---|---|---|---|
| | Cdac1 | Cdac2 | ∘ ∘ ∘ | Cdacm |

FIG. 6

EXAMPLE OF MEMORY FILLING WITH NON-EMPTY STACK (m=6, V[k]=10)

NON-LINEARITY ERROR REMAINDERS FROM PREVIOUS SAMPLES

FILL GAPS IN PRIORITY, FROM LEFT TO RIGHT

CONTINUE FILLING FROM LEFT TO RIGHT LIKE THE EMPTY STACK CASE
REMAINING SEVEN TO FILL

RESULT OF THE REPARTITION:
{V1[k],..., V6[k]} ={2,2,1,1,2,2}

REMOVE COMPLETED LINES AND KEEP STACK TO MINIMAL HEIGHT

MEMORY FOR NEXT SAMPLE k+1

MEMORY FILLING WITH NEGATIVE VALUE

V[k]=-10

| 0 | 1 | 1 | 1 | 0 | 0 |
| Cdac1 | Cdac2 | Cdac3 | Cdac4 | Cdac5 | Cdac6 |

NON-LINEARITY ERROR REMAINDERS FROM PREVIOUS SAMPLES

FILL THE STACK -1 BY -1, WITH GAPS IN PRIORITY, FROM LEFT TO RIGHT A GAP FOR NEGATIVE BITSTREAM IS NOW A 1

V[k]=-10

|   | 1 | 1 | 1 |   |   |
| Cdac1 | Cdac2 | Cdac3 | Cdac4 | Cdac5 | Cdac6 |

GAPS TO BE FILLED IN PRIORITY

CONTINUE FILLING THE REMAINDER FROM LEFT TO RIGHT LIKE THE EMPTY STACK CASE

REMAINING SEVEN TO FILL

| -1 |    |    |    |    |    |
| -1 | -1 | -1 | -1 | -1 | -1 |
| Cdac1 | Cdac2 | Cdac3 | Cdac4 | Cdac5 | Cdac6 |

RESULT OF THE REPARTITION:
{V1[k],..., V6[k]} = {-2,-2,-2,-2,-1,-1}

FIG. 10A

REMOVE COMPLETED LINES AND KEEP STACK TO MINIMAL HEIGHT

| | | | | | |
|---|---|---|---|---|---|
| | | | | | |
| | | | | | |
| -1 | 0 | 0 | 0 | 0 | 0 |

Cdac1  Cdac2  Cdac3  Cdac4  Cdac5  Cdac6

DETERMINE THE EQUIVALENT
POSITIVE STACK REPRESENTATION:
ADD A LINE OF +1 (OPERATION THAT KEEPS
NON-LINEARITY REMAINDERS CONSTANT)

| | | | | | |
|---|---|---|---|---|---|
| | | | | | |
| | | | | | |
| 0 | 1 | 1 | 1 | 1 | 1 |

Cdac1  Cdac2  Cdac3  Cdac4  Cdac5  Cdac6

MEMORY FOR NEXT SAMPLE k+1

FIG. 10B

CHARGE-BASED DIGITAL TO ANALOG CONVERTER WITH SECOND ORDER DYNAMIC WEIGHTED ALGORITHM

PRIORITY

This application claims priority to U.S. Provisional Patent Application No. 62/664,511 filed Apr. 30, 2018, the contents of which are hereby incorporated in their entirety.

FIELD OF THE INVENTION

The present disclosure relates to circuits for digital to analog conversion (DAC) and, more particularly, to a charge-based digital to analog converter with second order dynamic weighted averaging algorithm.

BACKGROUND

Analog-to-digital converters (ADC) are in widespread use today in electronics for consumers, industrial applications, etc. Typically, analog-to-digital converters include circuitry for receiving an analog input signal and outputting a digital value proportional to the analog input signal. This digital output value is typically in the form of either a parallel word or a serial digital bit string. There are many types of analog-to-digital conversion schemes such as voltage-to-frequency conversion, charge redistribution, delta modulation, as well as others. Typically, each of these conversion schemes has its advantages and disadvantages. One type of analog-to-digital converter that has seen increasing use is the switched capacitor-based sigma-delta converter.

SUMMARY

Embodiments of the present disclosure include a digital to analog converter (DAC). The DAC may include a summing circuit. The summing circuit may be implemented by any suitable combination of analog circuitry, digital circuitry, or instructions for execution by a processor. The DAC may include at least two unit-DACs, though it may include any suitable number and kind of unit-DACs. A unit-DAC may be implemented by any suitable combination of analog circuitry, digital circuitry, or instructions for execution by a processor. A unit-DAC may be implemented by any suitable number of levels, such as five. Each unit-DAC may be configured to output an analog value proportional to its unit-DAC input. The output may be in an inherently linear manner. The output may be made synchronous with a clock signal. Each unit-DAC may include a gain mismatch when compared to other unit-DACs of the DAC. The summing circuit may be configured to sum outputs of the unit-DACs and output the sum as output of the DAC. The DAC may include a calculation circuit. The calculation circuit may be implemented by any suitable combination of analog circuitry, digital circuitry, or instructions for execution by a processor. The calculation circuit may be configured to receive a plurality of successive samples of DAC input. The samples may be sampled according to the clock signal. The calculation circuit may be configured to, for each sample received, partition the sample of DAC input to the unit-DACs based upon previous partitions of inputs to the unit-DACs, so that a sum of the unit DAC inputs is equal to an input of the DAC. The calculation circuit may be configured to, using integration of a plurality of successive DAC outputs, cancel out integrated non-linearities of outputs of the DAC caused by the gain mismatches of the unit-DACs. The calculation circuit may be configured to partition samples of DAC input to the unit-DACs through a recursive nth order partitioning algorithm, wherein n is greater than one. During the algorithm, for each DAC input, the calculation circuit may be configured to determine a first partition of the DAC input that would cancel an (n−1)th order previously integrated non-linearity, compute an equivalent DAC input of the first partition of DAC input, add the equivalent DAC input to the DAC input to obtain a total DAC input, use a first order algorithm to apply the total DAC input to the inputs of the unit-DACs to cancel out an nth order previously integrated non-linearity and yield a second partition of DAC input, sum the first partition of DAC input and the second partition of DAC input to generate a final partition (the final partition to be used as inputs to the unit-DACs for a current sample of the DAC input), and, based on the final partition of DAC input, compute non-linearity remainders at each order of integration.

Embodiments of the present disclosure include a method of converting a digital value to an analog value, including accessing at least two unit-DACs connected in parallel, wherein each unit-DAC includes a unit-DAC input, is configured to output an analog value proportional to its unit-DAC input in an inherently linear manner synchronous with a clock signal, and includes a gain mismatch when compared to other unit-DACs of the DAC. The method further includes summing outputs of the unit-DACs and output the sum as output of the DAC, receiving a plurality of successive samples of DAC input sampled according to the clock signal, partitioning the sample of DAC input to the unit-DACs based upon previous partitions of inputs to the unit-DACs so that a sum of the unit DAC inputs is equal to an input of the DAC, using integration of a plurality of successive DAC outputs to cancel out integrated non-linearities of outputs of the DAC caused by the gain mismatches of the unit-DACs, partitioning samples of DAC input to the unit-DACs through a recursive nth order partitioning algorithm, wherein n is greater than one. The algorithm includes, for each DAC input, determining a first partition of the DAC input that would cancel an (n−1)th order previously integrated non-linearity, computing an equivalent DAC input of the first partition of DAC input, adding the equivalent DAC input to the DAC input to obtain a total DAC input, using a first order algorithm to apply the total DAC input to the inputs of the unit-DACs to cancel out an nth order previously integrated non-linearity and yield a second partition of DAC input, summing the first partition of DAC input and the second partition of DAC input to generate a final partition, the final partition to be used as inputs to the unit-DACs for a current sample of the DAC input, and, based on the final partition of DAC input, computing non-linearity remainders at each order of integration.

BRIEF DESCRIPTION OF THE DRAWINGS

FIG. 6 is an illustration of data elements produced by ADCs, according to embodiments of the present disclosure.

FIGS. 10A and 10B are an illustration of an example of stack-filling using a positive V wherein there are limitations of where values may be placed due to unit-DAC max values, according to embodiments of the present disclosure.

DETAILED DESCRIPTION

Figure 1:
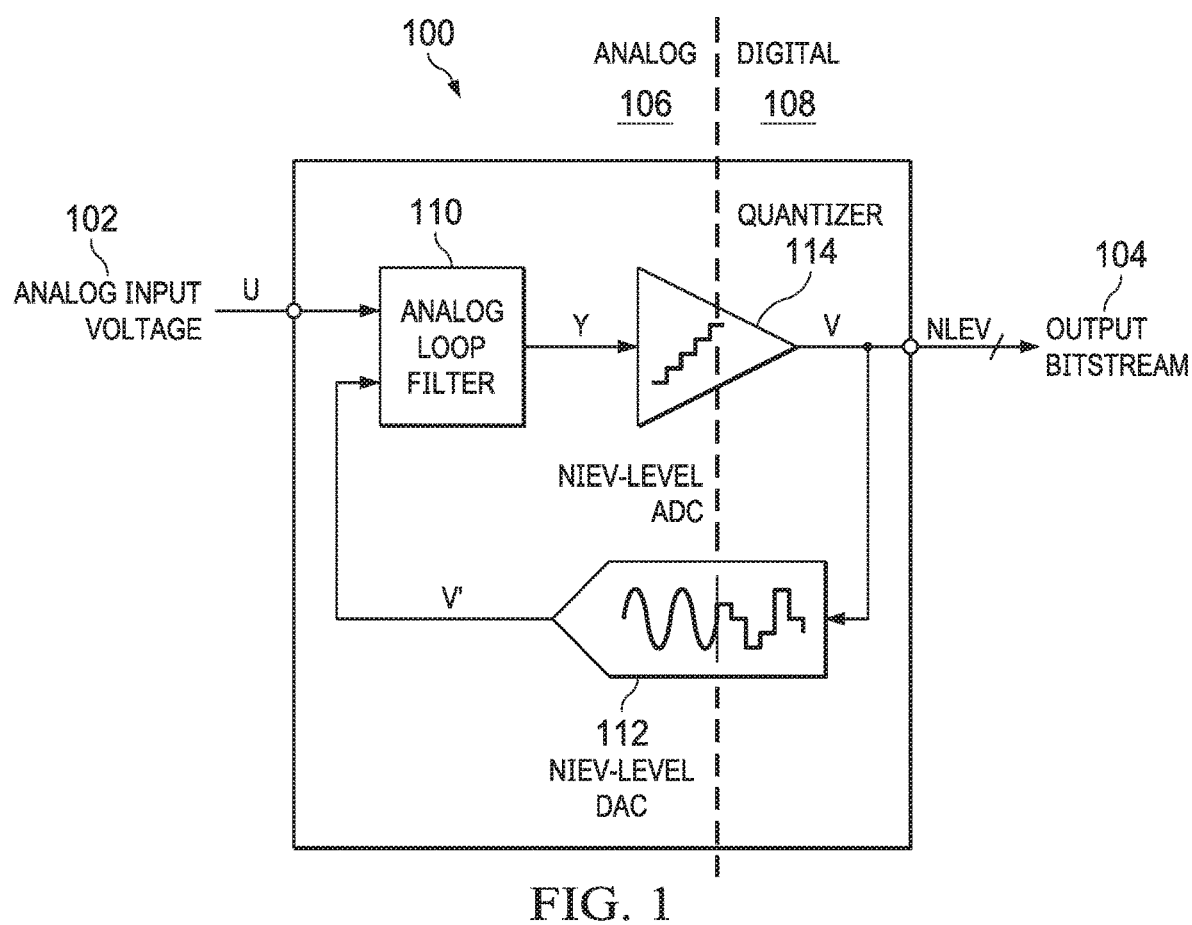
FIG. 1 is an illustration of an example analog to digital converter, according to embodiments of the present disclosure.

Embodiments of the present disclosure include a digital to analog converter (DAC). The DAC may include a summing circuit. The summing circuit may be implemented by any suitable combination of analog circuitry, digital circuitry, or instructions for execution by a processor. The DAC may include at least two unit-DACs, though it may include any suitable number and kind of unit-DACs. A unit-DAC may be implemented by any suitable combination of analog circuitry, digital circuitry, or instructions for execution by a processor. A unit-DAC may be implemented by any suitable number of levels, such as five. Each unit-DAC may be configured to output an analog value proportional to its unit-DAC input. The output may be in an inherently linear manner. The output may be made synchronous with a clock signal. Each unit-DAC may include a gain mismatch when compared to other unit-DACs of the DAC. The summing circuit may be configured to sum outputs of the unit-DACs and output the sum as output of the DAC. The DAC may include a calculation circuit. The calculation circuit may be implemented by any suitable combination of analog circuitry, digital circuitry, or instructions for execution by a processor. The calculation circuit may be configured to receive a plurality of successive samples of DAC input. The samples may be sampled according to the clock signal. The calculation circuit may be configured to, for each sample received, partition the sample of DAC input to the unit-DACs based upon previous partitions of inputs to the unit-DACs, so that a sum of the unit DAC inputs is equal to an input of the DAC. The calculation circuit may be configured to, using integration of a plurality of successive DAC outputs, cancel out integrated non-linearities of outputs of the DAC caused by the gain mismatches of the unit-DACs. The calculation circuit may be configured to partition samples of DAC input to the unit-DACs through a recursive nth order partitioning algorithm, wherein n is greater than one. During the algorithm, for each DAC input, the calculation circuit may be configured to determine a first partition of the DAC input that would cancel an (n−1)th order previously integrated non-linearity, compute an equivalent DAC input of the first partition of DAC input, add the equivalent DAC input to the DAC input to obtain a total DAC input, use a first order algorithm to apply the total DAC input to the inputs of the unit-DACs to cancel out an nth order previously integrated non-linearity and yield a second partition of DAC input, sum the first partition of DAC input and the second partition of DAC input to generate a final partition (the final partition to be used as inputs to the unit-DACs for a current sample of the DAC input), and, based on the final partition of DAC input, compute non-linearity remainders at each order of integration.

In combination with any of the above embodiments, the calculation circuit may be further configured to cancel out non-linearity of the DAC by partitioning DAC input, in average over successive inputs, so that each unit-DAC input at each order of integration receives a same integrated value of input for each order of integration defined in the partitioning algorithm. In combination with any of the above embodiments, the analog values to be output by each unit-DAC include a charge to be transferred, proportional to its unit-DAC input, and output of the DAC is equal to a sum of charge transferred by the unit-DACs. In combination with any of the above embodiments, the calculation circuit may be further configured to, during a partitioning algorithm to cancel out non-linearity of the DAC by integrating non-linearity to an nth order, determine a failure of results to converge, and, upon determining the failure of results to converge, perform another partitioning algorithm to cancel out non-linearity of the DAC by integrating non-linearity to an order lower than the nth-order. In combination with any of the above embodiments, the calculation circuit may be further configured to, after performing the other algorithm to cancel out non-linearity of the DAC by integrating non-linearity to the order lower than the nth-order, reuse the algorithm to cancel out non-linearity of the DAC by integrating non-linearity to the nth order. In combination with any of the above embodiments, the calculation circuit may be configured to define an order of partitioning, wherein unit-DACs are assigned input from the DAC input with a priority according to the defined order. The order of partitioning may be random, from left to right (lowest index to highest index), from right to left (highest index to lowest index), start at any index, one-by-one, two-by-two, and may change between inputs. In combination with any of the above embodiments, the calculation circuit may be further configured to, between successive partitions of DAC input to the unit-DACs, shuffle the defined order, the shuffling configured to break periodicity of output of the DAC. In combination with any of the above embodiments, the calculation circuit may be further configured to access a memory for each order of integration to be used by partitioning algorithms, wherein each memory includes a two-dimensional array of memory locations, each column of each two-dimensional array is configured to represent each unit-DAC, and, at each order of integration, each row of the two-dimensional array is configured to represent an integrated value of the unit-DAC inputs at the order of integration or a representation of the non-linearity remainder of each unit-DAC outputs integrated at the order of integration. In combination with any of the above embodiments, for a first order of integration of non-linearity, the two-dimensional array of memory locations may be configured to represent a given unit-DAC input with a single bit per column. In combination with any of the above embodiments, the calculation circuit may be further configured to determine that attempts to provide the same integrated value for each unit-DAC input for a given order of integration with a partitioning algorithm will not succeed and lead to a memory overflow, and, based on the determination that the attempts will not succeed, resetting one or more rows of the two-dimensional array representing the given order of integration non-linearity remainders so that the memory overflow is removed. The attempt might not succeed because sufficient memory locations may be unavailable. In combination with any of the above embodiments, the calculation circuit may be configured to determine that attempts to provide the same integrated value for each unit-DAC input for a given order of integration will not succeed with an nth-order partitioning algorithm, and perform an (n−1)th order partitioning algorithm to provide a cancellation of the non-linear remainders at the order (n−1). In combination with any of the above embodiments, a given input for the DAC may be configured to be expressed in an input count, wherein individual elements of the input count represents a value to be converted by a given unit-DAC and element of the input count is assigned to a given unit-DAC. In combination with any of the above embodiments, the calculation circuit may be configured to partition samples of DAC input to the unit-DACs to assign input to unit-DACs by successively filling, according to the defined order of partitioning, memory locations of one of the two-dimensional arrays with an element of the input count until all elements of the input count are assigned to memory locations, wherein the filling made to the memory locations of the one of the two-dimensional arrays is summed by column to an empty one-dimensional array to obtain a partition of the DAC input to unit-DACs, and wherein the filling is configured to cancel non-linearity remainders in the two-dimensional arrays. In combination with any of the above embodiments, the calculation circuit may be configured to perform the filling in a one-by-one sequential order manner. In combination with any of the above embodiments, the calculation circuit may be configured to perform filling of subsequent orders of integration by summing remainders of non-linearity based upon partitioning and the current state of the two-dimensional arrays. In combination with any of the above embodiments, the calculation circuit may be further configured to determine a maximum input range for an individual unit-DAC for a given DAC input, determine whether a column for the individual unit-DAC has been filed with elements of the input count for the given DAC input so as to reach the maximum input range, and, based on a determination that the column has reached the maximum input range for the given DAC input, omitting further filling of the column for the given DAC input. In combination with any of the above embodiments, the calculation circuit may be further configured to fill unfilled bottom rows of the two-dimensional arrays before filling other rows of the two-dimensional arrays. In combination with any of the above embodiments, the calculation circuit may be further configured to determine whether a given column of the two-dimensional arrays are filled to capacity during a given DAC input, and, based upon the determination that the given column is filled to capacity, omitting further filling of the column for the given DAC input. In combination with any of the above embodiments, the calculation circuit may be further configured to, upon attempting to fill a memory location in a given column of the two-dimensional arrays, determine whether the given column has been prevented from accepting further filling with elements. In combination with any of the above embodiments, the calculation circuit may be further configured to, after filling the memory locations of the two-dimensional arrays with a given DAC input, clearing completely filled rows of the two-dimensional arrays. In combination with any of the above embodiments, the calculation circuit may be further configured to partition samples of DAC input to the unit-DACs by assigning input to unit-DACs by filling memory locations with elements from the count into empty memory locations of a bottom row of a first two-dimensional array, upon filling the bottom row of the first two-dimensional array, (A) assign input to unit-DACs by filling memory locations with elements from the input count into empty memory locations of a next higher row of the first two-dimensional array, and (B) for a subsequent input for the DAC, maintain values present in the next higher row of the first two-dimensional array and assign elements of another input count of the subsequent input into empty memory locations of the next higher row of the first two-dimensional array. In combination with any of the above embodiments, the calculation circuit may be further configured to determine an initial status of the first-dimensional array including a remainder count of an incomplete bottom row of the first-dimensional array, add the remainder count to the input count to get a total count, fill memory locations with elements from the total count into empty memory locations of the bottom row of the second two-dimensional array, and, upon filling the bottom row of the second two-dimensional array, (A) assign input to unit-DACs by filling memory locations with elements from the total count into empty memory locations of a next higher row of the second two-dimensional array, and (B) for a subsequent input for the DAC, maintain values present in the next higher row of the second two-dimensional array and assign elements from a subsequent total count into empty memory locations of the next higher row of the second two-dimensional array.

Embodiments of the present disclosure may include an ADC including one or more DACs of any of the above embodiments.

Embodiments of the present disclosure may include a method performed by any of the ADCs or DACs of the above embodiments.

FIG. 1 is an illustration of an example analog to digital converter 100, according to embodiments of the present disclosure. An analog input voltage 102 may be received to be converted to a digital value represented by output bitstream 104. Implementation of ADC 100 may include representation in an analog domain 106 and a digital domain 108. In one embodiment, ADC 100 may be implemented using a switched capacitor-based sigma-delta converter. ADC 100 may be implemented as a charge-based converter. ADC 100 may include an analog loop filter 110, a quantizer 114, and a feedback DAC 112. Analog loop filter 110, quantizer 114, and feedback DAC 112 may be implemented by any suitable combination of analog or digital circuitry, application specific integrated circuits, field-programmable gate arrays, or combination thereof.

Analog input voltage 102 may be input as signal U and fed to analog loop filter 110. The output signal Y of analog loop filter 110 may be forwarded to quantizer 114 which may be configured to provide the output digital bitstream V representing a digital value of analog input voltage 102. V may be a multi-bit bitstream. V may be connected to the input of feedback DAC 112. The output of feedback DAC 112, analog output V' (which may be analog conversion of V through DAC) may be fed back to analog loop filter 110. In one embodiment, analog loop filter 110 may be configured to operate such that the quantity of charge sampled throughout the conversion by charge-based feedback DAC 112 is substantially equal to the quantity of charge sampled at the analog inputs of ADC 100.

Since output of feedback DAC 112 is fed back to the same analog node as the analog inputs of ADC 100, ADC 100 might not be more linear than feedback DAC 112. Thus, the linearity performance of ADC 100 is limited by linearity of its feedback DAC 112. Therefore, a very linear digital-to-analog converter may be required in order to achieve a more perfectly linear analog-to-digital conversion. However, a high resolution might not be required for feedback DAC 112 to perform its role in the feedback loop of a sigma-delta converter such as ADC 100. Thus, in one embodiment, design of ADC 100 may result in an exchange of the digital-to-analog resolution for an over-sampling ratio at a cost of a longer conversion time. Feedback DAC 112 may be preferably implemented with a multi-level DAC, rather than a 2-level (or single-bit) DAC, as such a choice may increase converter resolution, induce less quantization noise, induce a better stability of the modulator and therefore a better dynamic range and less sensitivity to idle tones as well as better distortion behavior. A multiple-level implementation of quantizer 114 may be possible as such an implementation does not require as much accuracy as feedback DAC 112. Since the output of feedback DAC 112 resides at the input of ADC 100, the inaccuracies of feedback DAC 112 are directly transmitted to the input signal and may be difficult to compensate since analog loop filter 110 cannot filter and decorrelate DAC output and analog input signals during its process. Therefore, embodiments of the present disclosure fulfill a discovered, critical need to be able to realize linear DACs with as many levels as possible.

Figure 2:
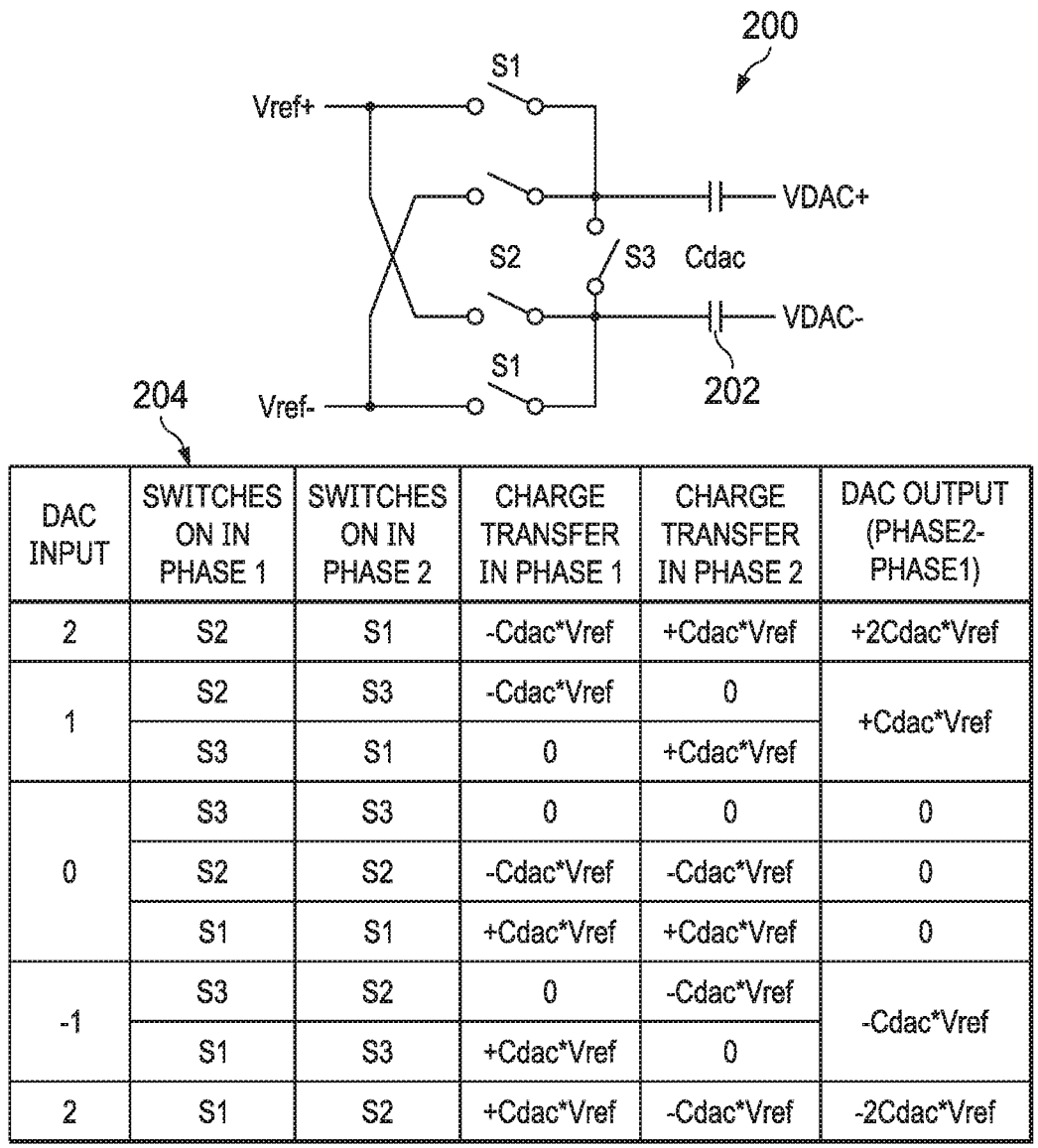
FIG. 2 illustrates an example 5-level, single capacitor pair DAC.

FIG. 2 illustrates an example 5-level, single capacitor pair DAC 200. DAC 200 may include a single capacitor pair 202 with a capacitance of Cdac, switches S1, S2, and S3, input voltages Vref+ and Vref−, and output voltages VDAC+ and VDAC−. Table 204 illustrates example operation of DAC 200. In sigma delta converters, capacitive charge transfer DACs such as DAC 200 may be used to realize the feedback of the modulator if the modulator is made of switched capacitors. In each of two phases, there may be one sample taken and one charge transfer performed. In DAC 200, the charge transfer DACs are single-bit (2-level) and made of one capacitor pair (in a fully-differential implementation). In U.S. Pat. No. 7,102,558, a switched-capacitor charge-based DAC can be realized with inherent linearity up to 5-levels if used in a 2-phase (one sampling, one charge transfer per phase) sigma-delta modulator system. Since only one capacitor pair is used in DAC 200, the linearity of such a DAC is inherent and is not dependent on mismatch. Mismatch inside the capacitor pair induces a gain error and common mode difference only, rather than a non-linearity. However, the number of levels might not be able to be enlarged without increasing the number of required capacitor pairs or the number of phases.

Figure 3:
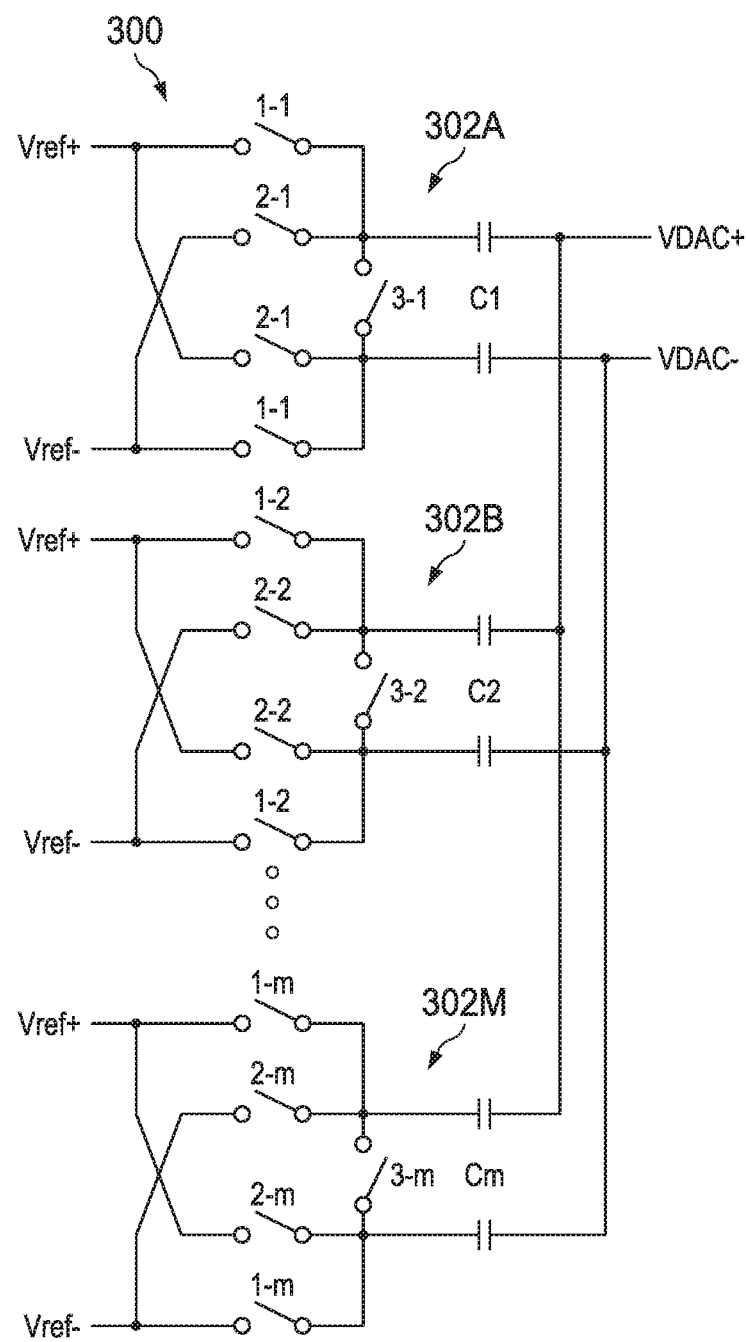
FIG. 3 is an illustration of a multi-level DAC.

FIG. 3 is an illustration of a multi-level DAC 300. Multi-level DAC 300 may include m multiple, independent 5-level DACs such as DACs 302A, 302B . . . 302m. Multi-level DAC 300 may include an arrangement of m DACs from FIG. 2. Multi-level DACs with more than 5 levels such as those in U.S. Pat. No. 7,994,958 require multiple capacitor pairs (if the implementation is fully-differential) and thus are susceptible to capacitor pairs mismatch that potentially degrade their linearity. Instead, a multi-level DAC with more than 5 levels might be implemented with the multiple independent 5-level DACs (unit-DACs) 302 implemented in parallel as shown in FIG. 3. Unit-DACs 302 each only incorporate one capacitor pair and all have inherent linearity if considered individually. When processed in parallel, the sum of the inputs to unit-DACs 302 is equal to the desired bitstream input of the multi-level DAC 300. In one embodiment, each individual input may be chosen by an internal selection algorithm. In a further embodiment, the algorithm may ensure that the sum of the inputs is equal to the value of the desired input bitstream. Since a mismatch can be present between unit-DACs 302—typically arising from a mismatch between the capacitor pairs—the linearity of the multi-level DAC 300 may depend heavily on the selection algorithm to allocate each unit-DAC 302 a specific input so that the sum of these inputs is equal to the input bitstream value.

Figure 4:
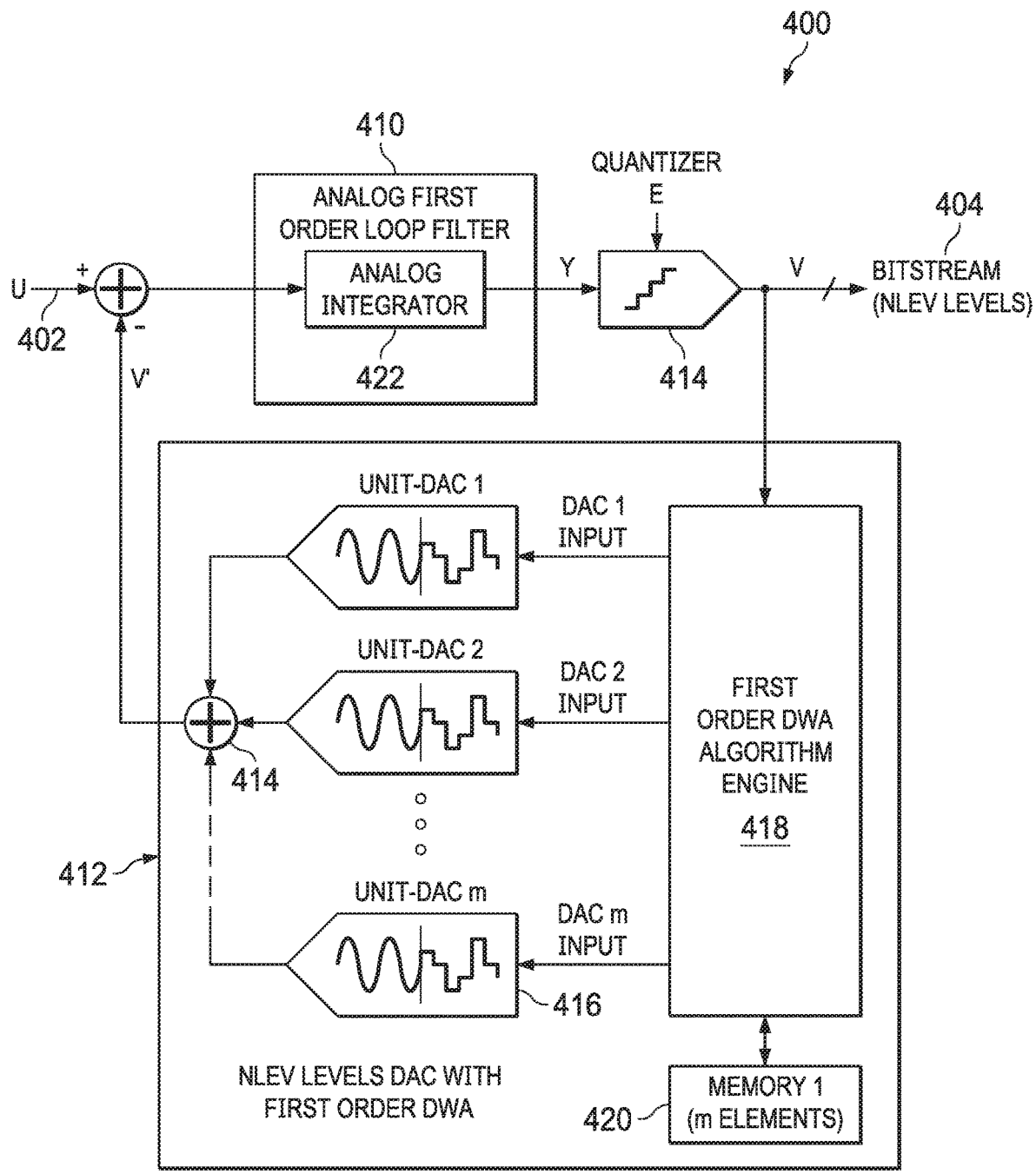
FIGS. 4 and 5 are illustrations of ADCs with an algorithm to maintain linearity, according to embodiments of the present disclosure.
Figure 5:
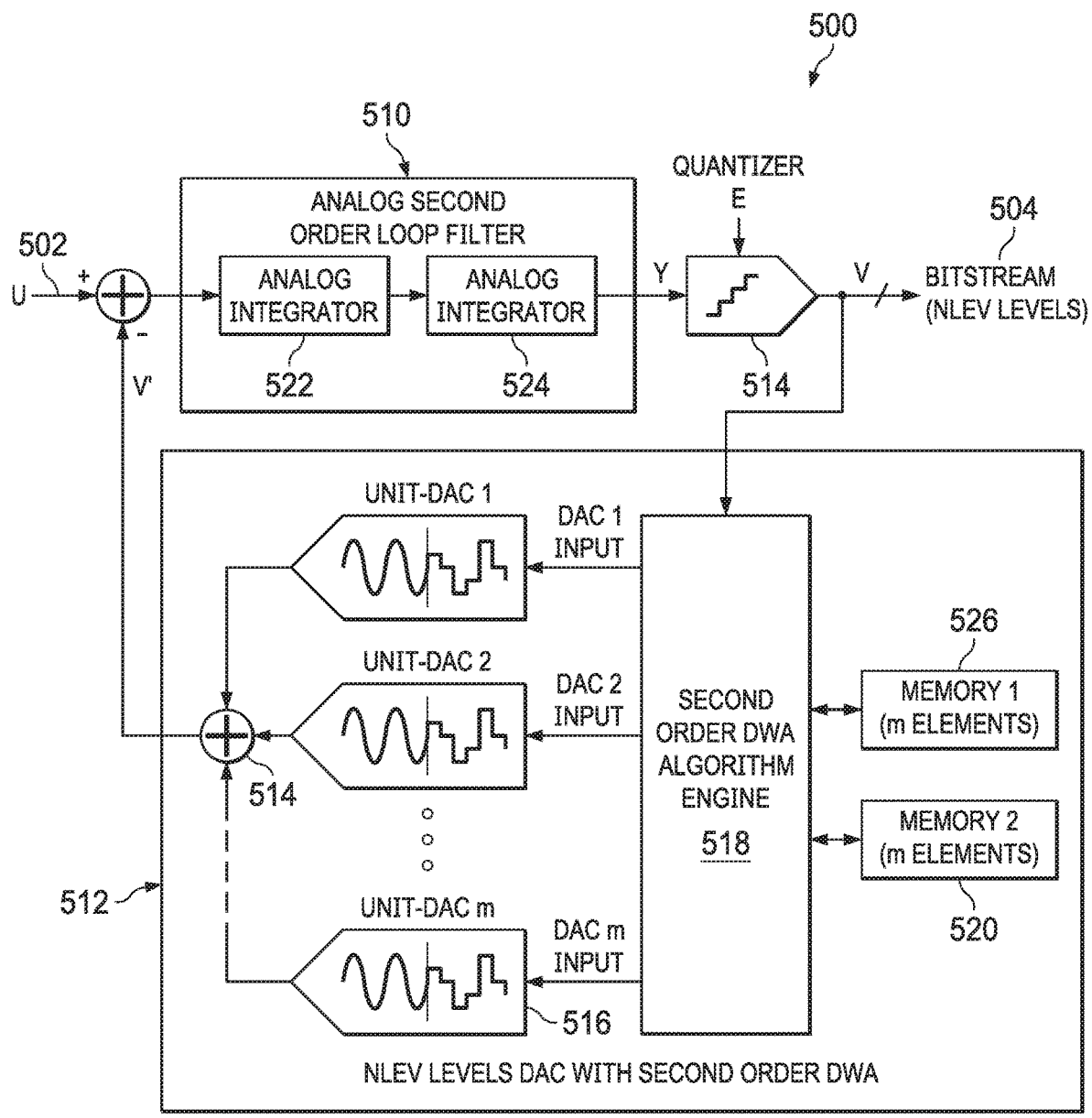

FIGS. 4 and 5 are illustrations of ADCs 400, 500 with an algorithm to maintain linearity, according to embodiments of the present disclosure.

FIG. 4 may illustrate ADC 400 with a delta-sigma modulator and multi-bit DAC composed of m unit-DAC elements, controlled by a first order DWA engine associated with a memory array that processes and calculates the repartition of the incoming bitstream based on the bitstream current input value and based on the previous memory states so that each unit-DAC can process its own input value at any sample k, in order to reduce or cancel the non-linearities induced by the possible mismatch of the unit-DACs after one integration within the sigma-delta loop.

FIG. 5 may illustrate ADC 500 with a delta-sigma modulator with a multi-bit DAC composed of m unit-DAC elements, controlled by a second order DWA engine associated with two memory arrays that process and calculate the repartition of the incoming bitstream based on the bitstream current input value and based on the previous memory states so that each unit-DAC can process its own input value at any sample k, in order to reduce or cancel the non-linearities induced by the possible mismatch of the unit-DACs after one and also after two integrations within the sigma-delta loop.

ADCs 400, 500 may implement the ADC 100 of FIG. 1. ADC 400 may implement an ADC with a first-order loop filter and algorithm. ADC 500 may implement an ADC with a second-order loop filter and algorithm. Inputs 402, 502 may implement input 102 of FIG. 1. Outputs 404, 504 may implement output 104 of FIG. 1. Analog loop filters 410, 510 may implement analog loop filter 104 of FIG. 1. Quantizers 414, 514 may implement quantizer 114 of FIG. 1. DACs 412, 512 may implement DAC 112 of FIG. 1. Analog loop filter 410 may include an analog integrator 422. Analog loop filter 510 may include two analog integrators 522, 524. DACs 412, 512 may each include respective unit-DACs 416, 516. Unit-DACs 416, 516 may implement the unit-DACs of FIG. 3. DACs 412, 512 may each include a quantity m of respective unit-DACs.

In one embodiment, in order to recover the linearity of a multi-level DAC throughout the conversion process, a dynamic element matching (DEM) algorithm can be applied to DACs of ADCs 400, 500. The algorithm may be performed by engines 418, 518. Engines 418, 518 may be implemented by analog circuitry, digital circuitry, instructions for execution by a processor, digital combinatorial logic, or any suitable combination thereof. Engine 418 may implement a first order algorithm. Engine 518 may implement a second order algorithm. Engine 418 may be configured to access a memory 420. Memory 420 may be configured to include m elements. Engine 518 may be configured to access memories 520, 526, which may each be configured to include m elements.

The purpose of this DEM algorithm may be that after one integration for a first order algorithm (or n integrations conducted in series for a n-th order algorithm) of multiple DAC outputs summed at 414, 514, linearity is maintained. Integrations may be performed for the duration of the oversampling rate of the sigma-delta converter. The sum, or the n-th order sum, of the unit-DAC 416, 516 outputs is still proportional to the sum (or the n-th order sum) of the bitstream outputs. Thus, linearity is maintained after an integration (or n integrations). This linearity may be accomplished even considering the existing mismatch between each unit-DAC 416, 516. If such algorithm is applied to a DAC, then the linearity of the sigma-delta ADC is maintained at a desired high level, provided that the algorithm is sufficiently efficient to keep the sum (or n-th order sum) of unit-DAC 416, 516 outputs proportional to the output bitstream sum (or n-th order sum) of the overall ADC 400, 500.

The DEM algorithm may be used in any suitable DAC circuit implementation and any type of DAC (charge-transfer, whether voltage or current) as long as the DAC can be split in multiple unit-DACs that are inherently linear, wherein outputs can be summed together and in which the sum of the inputs would be equal to the desired input bitstream. Such DACs may be implemented, for example, according to those shown in FIG. 3 or in U.S. Pat. No. 7,994,958, wherein the DAC is a charge-transfer DAC that is composed of multiple unit 5-level DACs in parallel, composed themselves of a set of five switches and one capacitor pair, transferring their charge on two phases with an independent input at each phase and at each capacitor pair. Embodiments of the present disclosure include a novel DEM algorithm that can be used for recovering the linearity of a multi-level DAC composed of multiple mismatched unit-DACs for an n-th order integration sequence.

DEM algorithms may be categorized in different ways, depending on how the selection of the input for the multiple unit-DACs is performed. The Dynamic Weighted Averaging (DWA) category is a category of algorithms that includes a global memory of the previous integrations performed or of the remaining non-linearity errors integrated. A DWA algorithm may select inputs for the unit-DACs based on the current bitstream and on the previous memory state. Accordingly, no matter the status of the memory and current bitstream, the best possible selection may be performed to recover from non-linearity errors. Embodiments of the present disclosure may include a DWA DEM algorithm that can be applied to any sum order ($1^{st}$, $2^{nd}$, etc.) that is necessary or used. Typically, the order of the sum will be determined by the architecture of the sigma-delta analog loop filter and will be equal to the order of analog loop filter (such as filters 410, 510), where the order of the loop is given by the maximum number of integrations in series inside the loop.

Embodiments of the present disclosure may include multi-bit DACs 412, 512 as a parallel arrangement of 5-level unit-DACs 416, 516 using a DWA DEM technique to maintain a high DAC linearity. At each sample, each unit capacitor in the DAC can be charged with 5 different levels, that can be normalized to (+2/+1/0/−1/−2)*Cdac*Vref. The (+2/+1/0/−1/−2) may correspond to the five levels. The goal is that at each sample, the sum of the charge transferred by the DAC is proportional to both the sum of all the unit capacitors, and the sum of the input bitstream, so that the linearity is always maintained.

In FIG. 4, for a first order operation, the simple sum of the charges, integrated over each sample should converge to a value that is proportional to the sum of the unit capacitor value (each capacitor has a different value due to mismatch), and proportional to the sum of the desired inputs. In FIG. 5, for a second order operation, the sum of the sum of charges integrated should be proportional to both the sum of the unit capacitor values (each capacitor has a different value due to mismatch), and proportional to the sum of the sum of the desired inputs.

FIG. 6 is an illustration of data elements produced by ADCs 400, 500, according to embodiments of the present disclosure. FIG. 6 illustrates a possible representation of the bitstream 602 V[k] at each sample k, of the calculated repartition {V1[k], . . . , Vm[k]} corresponding to each unit-DAC, and of the memory arrays 604, 606 depicted in FIGS. 4 and 5 ($S_1[k]=\{S_{1,1}[k], \ldots, S_{1,m}[k]\}$ and $S_2[k]=\{S_{2,1}[k], \ldots, S_{2,m}[k]\}$) that can also be represented as memory stacks with multiple rows for a simpler understanding and management process. Bitstream 602 may represent an array of outputs. Bitstream 602 may be defined as bitstream V. At each sample k, the bitstream V can take a new value V[k] that is the result of the quantizer after having processed the analog inputs and previous DAC outputs through the sigma-delta loop.

V[k] may have successive values for successive samples of the ADC. V[k] may represent the k-th sample in the conversion process. Each unit-DAC has its own input value Vi[k], wherein (i∈[1,m]), varying at each sample and such that $V[k]=\Sigma_{i=1}^{m} Vi[k]$. The state of the bitstream is then represented by the array {V1(k), . . . , Vm(k)}. The algorithm includes determining this array at each sample k to fulfill the equation $V[k]=\Sigma_{i=1}^{m} Vi[k]$ and to maintain proper linearity of the DAC.

In one embodiment, the input value V[k] for a DAC—the DAC composed of m elements and having a 5-level unit-DAC—may be an integer comprised between 2*m and −2*m. Each Vi[k] in this case is an integer number comprised between −2 and +2. The input value V[k] represents the amount of charge that will need to be transferred by the DAC at the next sample (k+1). The amount of charge may be equal to Cdac*Vref*V[k] if all the unit-DACs were matched and all capacitors had a capacitance equal to Cdac.

In non-ideal circuits, the capacitors of the unit-DACs depicted in FIG. 3 may be mismatched and can be noted as Cdaci, wherein i is in the range [1. . . m] for a m-element DAC. It may be assumed that there is no mismatch between the capacitors of a given capacitor pair within a unit-DAC. Such an assumption may be valid as the circuits are fully differential as the mismatch within one pair of capacitors does not affect linearity of the unit-DAC. Furthermore, even if the capacitors within a pair are mismatched, their mismatch will only lead to common mode transfers and the differential mode transfer will be as-if the capacitors were actually matched but having an additional gain error. Accordingly, the sum of the capacitors satisfies the equation: $\Sigma_{i=1}^{m} Cdaci=m*Cdac$. This assumption may be made to remove the gain error from the calculations in the algorithm. The DEM algorithms of ADCs 400, 500 might not necessarily cancel a possible gain error while cancelling possible non-linearities due to the mismatch of the unit-DAC capacitors. If a perfect gain error is obtained with a desired value Cref for every pair and if the average of the capacitors is equal to another value (m*Cdac), then a gain error (Cdac-Cref)/Cref may be induced in the system. However, the gain error may be decorrelated from non-linearity errors and may be removed through calibration using any suitable technique. The Cdac of a given capacitor pair for a given unit-DAC, Cdaci, may be equal to (Cdac+e(i)) where e(i) is the mismatch error compared to the average Cdac value of all unit-capacitors. Since gain error is not considered, the equation $\Sigma_{i=1}^{m} e(i)=0$ is satisfied by definition, which gives the result of $\Sigma_{i=1}^{m} Cdaci=m*Cdac$.

The DEM algorithms of ADCs 400 may be configured to process V[k] at each sample and, based on the previous history with the memory of stack 604, to give a repartition {V1[k], . . . , Vm[k]} of the bitstream among all the unit-DACs so that the following equation: $\Sigma_{i=1}^{m} Vi[k]=V[k]$ is respected and so that $\Sigma_{k=0}^{Nconv}\Sigma_{i=1}^{m} Vi[k]*Cdaci$ is proportional to Cdac in a first order algorithm. This condition, if met, ensures the linearity of the DAC and therefore of the ADC converter throughout the conversion process, when a first order sigma-delta modulator is implemented.

In an exemplary embodiment, all unit-DACs may be 5-level DACs. Accordingly, their inputs Vi[k] for sample k can be represented by an integer between +2 and –2. The algorithm may be configured to use the value V[k] and the past history to give a set of values Vi[k] comprised between –2 and +2 so that $\Sigma_{i=1}^{m} Vi[k]=V[k]$ and so that the total sum of integrated Vi[k]*Cdaci over k samples is as close as possible to a multiple of Cdac*Vref. Since Cdaci=Cdac+e(i) and $\Sigma_{i=1}^{m} e(i)=0$, the conditions may be rewritten to cancel the Cdac terms for simplification. Furthermore, the same conditions may be stated by requiring that the sum $E_{k=0}^{Nconv} \Sigma_{i=1}^{m} Vi[k]*e(i)$ be as close as possible to zero to ensure the best linearity of the DAC during the conversion process. At each sample k, the individual components of Vi[k] can be represented by an array of m integers comprised between –2 and +2 and ordered with respect to i being from 1 to m: {V1[k], . . . , Vm[k]}. A goal of the DEM algorithm is to determine what is the best repartition of {V1[k], . . . , Vm[k]} to ensure the best linearity possible and maintain the sum $\Sigma_{k=0}^{Nconv} \Sigma_{i=1}^{m} Vi[k] *e(i)$ as close as possible to 0, with the given constraint to respect the equation $\Sigma_{i=1}^{m} Vi[k]=V[k]$. Implementations using a different unit-DAC type will lead to a different range of integer values. However, such a representation is still valid with an array of m integers where only the range of integers would vary. The algorithm can thus be implemented regardless of the allowed range of each unit-DAC input.

The memory of the previous DAC values would be too large if the memory stored all Vi[k] for each sample k. In one embodiment, for the non-linearity cancellation algorithm, what is stored may include the difference between what has been integrated as a sum of charges versus what would have been integrated if all unit-DACs were given the same input values. This difference corresponds to the non-linearity remainder at each sample k, expressed in a unit that is Cdaci*Vref for each i-th column. This difference can be represented by stack 604 which is an array of integers which fully represents the unit-DACs on each column. At each integration, a new stack can represent the non-linearity remainder at the o-th order sum after o integrations. For example, stack 604 may be denoted as S, sample k, and unit-DAC identifier i, at the order o forming an array of $S_{o,i}[k]$: {$S_{o,1}[k]$, . . . , $S_{o,m}[k]$}. Although a single row of stack 604 is shown with $S_{o,i}[k]$ values being integer numbers (each integer i in the array may represent an individual unit-DAC identifier), stack 604 may be represented by multiple rows with 1, 0 or –1 values per stack cell for a better visualization and a better understanding of the filling process. In this representation, each stack at each integration order may be a matrix of 0/+1/–1 integers, so that each $S_{o,i}[k]$ is a column of the matrix, and that within each column, the number of rows containing 1's or –1's at the bottom of the column is equal to the $S_{o,i}[k]$ value and all other rows are filled with zeros. In this representation, each cell value s represents a unit charge s*Cdaci*Vref. The number of rows of the o-th order stack may then be equal to Max($S_{o,i}[k]$) if all $S_{o,i}[k]$ are having the same sign. FIG. 6 shows an exemplary representation in an array of integers or in a multiple row matrix 606. This representation illustrates the filling process.

The value in the cell may represent the number of times the associated unit-DAC charge (Cdaci*Vref) has been integrated in the past. The value in the call may satisfy the equation: $\Sigma_{k=0}^{Nconv} Vi[k]=S_{1,i}[k]$. However, the value $S_{1,i}[k]$ might get too large and thus need a mechanism to keep the value bounded so that the memory on the chip is limited to a small size. The goal of the algorithm is to determine the Vi[k] repartition desired to optimize and cancel non-linearities due to unit-DAC mismatch and not to record how much total charge has been integrated. As $\Sigma_{i=1}^{m} e(i)=0$, the non-linearity error at sample k at the o-th order is cancelled if all $S_{o,i}[k]$ are equal for every i in the stack. More particularly, if $S_{1,i}[k]$ is rewritten as S0+si[k] for each i-th position, then S0 can always be reset to 0 so that only the remainder of the non-linearity si[k] is kept into the memory. Furthermore, memory may be reset if all $S_{1,i}[k]$ are equal, since the goal of the stack is to retain only non-linearity error remainders accumulated on the corresponding unit-DAC. Thus, if the stack is represented with rows as shown in the elements of FIG. 6, each row may be reset to zero or "cleared" or "cancelled" every time the elements of $S_{1,i}[k]$ are equalized or the same for the entire row. Afterwards, the contents of the row of the stack need not be stored after all $S_{1,i}[k]$ are filled and thus equal. As a result, a track of the total integrated charge need not be maintained but just the remainder of the non-linearity accumulated on the corresponding unit-DAC which makes the memory requirement of the stack well reduced. Accordingly, the array of $S_{1,i}[k]$ values will act as a stack where values Vi[k] would be integrated at each sample, and where every time the $S_{1,i}[k]$ values would be equal within a row, the corresponding stack row would be reset and cleared from the memory.

This operation works such that the stack can be kept with only positive integers, as adding a positive integer to all elements in the stack is essentially equivalent. This property can be used to simplify the representation and to be able to treat the stack as a matrix of simple bits (0/1 integers). This technique allows diminishment of the memory requirements so that for an exemplary first order algorithm the $S_{1,i}[k]$ can be limited to a single bit, such as zero or one, and therefore the stack is limited to a single row as well.

Figure 7:
FIG. 7 is a flow chart for a first order algorithm, according to embodiments of the present disclosure.

FIG. 7 is a flow chart for an example a first order algorithm 700, according to embodiments of the present disclosure. Algorithm 700 may be a first order DWA algorithm proposed in order to cancel or diminish the non-linearity induced by the mismatch in the DAC composed with m unit-DACs in parallel that show mismatch after a first order integration.

Algorithm 700 may represent operation of any of the elements of FIGS. 1-6. Algorithm 700 may include any suitable number of steps. Steps shown in algorithm 700 may be omitted, repeated, performed in parallel with one another, performed recursively, or routed to other steps of algorithm 700 in any suitable order. Algorithm 700 may include more or fewer steps than illustrated in FIG. 7.

At 705, at the beginning of the conversion (k=0), all stacks may be reset and filled with zeros. The bitstream values of V and bitstream input array Vi may be reset to zero. These reset values may be necessary to determine a starting point. The value k, representing the sample number, may be reset to zero. Algorithm 700 may proceed to 710.

At 710, it may be determined whether sigma-delta conversion of analog input values is to be performed. Such a determination may be based on a start conversion digital trigger signal coming from the digital portion of the circuit. If conversion is to be performed, algorithm 700 may proceed to 715. Otherwise, algorithm 700 may return to 705.

At 715, when the conversion process of algorithm 700 is running, the k value maybe incremented. The k value may represent the sample number in the conversion process. It may be determined whether k has reached or exceeded a specified number of samples. If so, algorithm 700 may proceed to 720. Otherwise, algorithm 700 may proceed to 725.

At 720, the conversion process may end. Algorithm 700 may proceed to 705.

At 725, at each sample k, the sigma delta loop may proceed with charge transfers for the current sample k, using DAC input of the previous value of the bitstream V[k−1] and the current analog input signals.

At 730, at the end of each sample time, the new bitstream value V[k] may be generated by the quantizer.

At 735, in one embodiment, at the beginning of each sample k, the position of the columns in the stack S can be shuffled. The shuffling may be performed using any suitable process, such as by using a random or pseudo-random sequence. The order can be modified at each sample since all unit-DACs are essentially equivalent. This shuffling might not otherwise impact operation of algorithm 700 as algorithm 700 may still cancel non-linearity of the DAC and the memory of each non-linearity is not affected. There might be no preference of integrating charge over a certain unit-DAC versus another unit-DAC. This property may allow charging any unit-DAC that has the same $S_{1,i}[k]$ stack value. This means the order of filling can be changed, provided that the filling priority is fulfilled. Additionally, the shuffling may act as a dither process and improve linearity of the device, as shuffling breaks possible patterns and correlation between the filling process and the bitstream. The shuffling may also simplify the filling process in that the filling process can then be defined only with one unique order. In the examples of the present disclosure, filling may be shown from left to right, with a rising value from 1 to m in terms of the column identifier. This shuffling may be used to reach high linearity performance and to possibly maintain idle tones at the output as low of an amplitude as possible.

At 740, after the shuffling step and once the bitstream V[k] has been determined by the quantizer, the repartition of the V[k] through all the unit-DACs may be performed. The repartition may be performed through the operation of filling a stack. This repartition may satisfy the condition that $V[k]=\Sigma_{i=1}^{m} Vi[k]$ at the end of the filling process. The filling process may include analyzing the current configuration of the stack S1 (or, $1^{st}$ order stack) in order to determine where the Vi[k] will be disseminated and with which value. Filling the stack may be performed in any suitable manner. FIGS. 8, 9, 10 and 11 describe specific examples of this filling process to help further understanding of this behavior.

Figure 8:
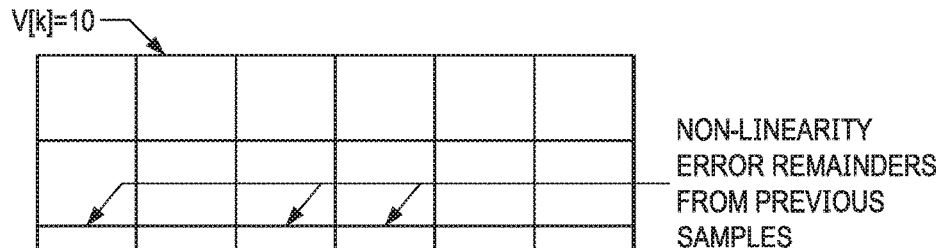
FIG. 8 is an illustration of an example of stack-filling using a positive V and an empty stack, according to embodiments of the present disclosure.
Figure 8:
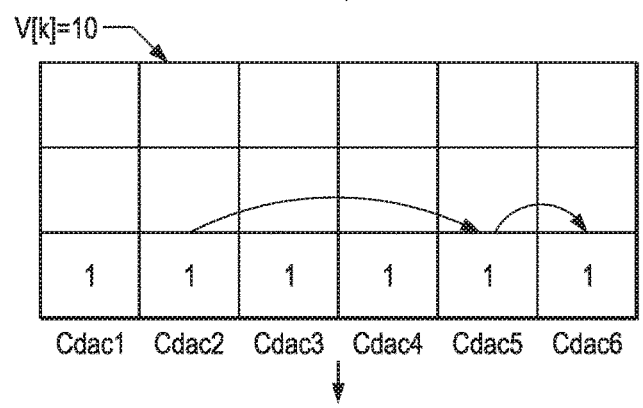
Figure 8:
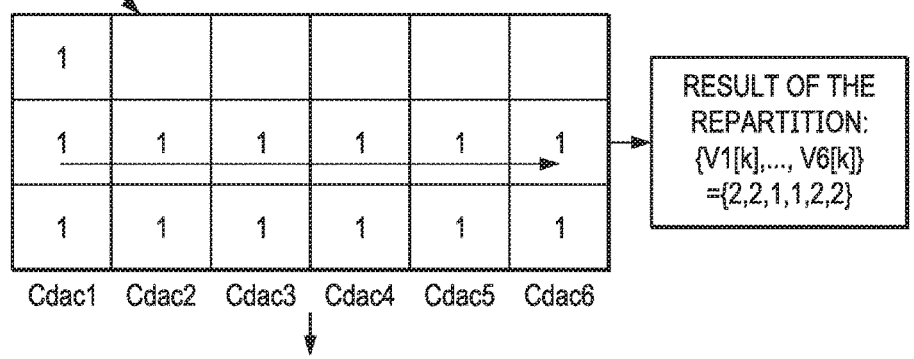
Figure 8:
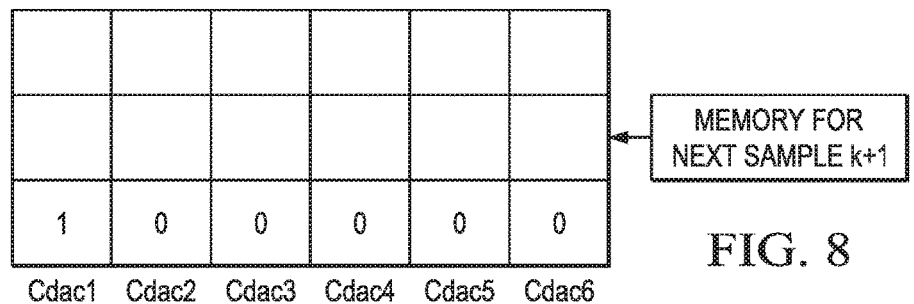

FIG. 8 is an illustration of an example of stack-filling using a positive V and an empty stack, according to embodiments of the present disclosure. FIG. 8 is an illustration of a simplest filling process. The process of FIG. 8 may illustrate an example implementation of step 740 of FIG. 7.

The process may begin with an empty stack (the stack, for example, after reset at sample k=0). Taking V[k] as equal to V, assuming a positive number for simplicity (which is possible due to the aforementioned property of the stack that shows that the non-linearity can always be represented with a positive number in the stack), it can be written that V=a*m+b wherein a and b are respectively the Euclidian division (of V by m) quotient and remainder. Starting with an empty stack, the first order algorithm may fill the stack with 1s starting from left to right (from 1 to m in a crescent order) and continue until reaching a V number of 1's filled. This filling process fills one from left to right in the matrix and returns at the left once end of row is reached and ends when V is reached. The stack would thus have an (a+1) value for the first b columns and an (a) value for the last m-b columns. Thus, starting from an empty stack, the stack value for each column is $\{S_{1,1}[k], \ldots, S_{1,b}[k], S_{1,b+1}[k], \ldots, S_{1,m}[k]\}=\{a+1, \ldots, a+1, a, \ldots, a\}$. Since each value can be written $S_{1,i}[k]=a+si[k]$, the stack can be simplified and rewritten to an equivalent state to: $\{S_{1,1}[k], \ldots, S_{1,b}[k], S_{1,b+1}[k], \ldots, S_{1,m}[k]\}=\{1, \ldots, 1, 0, \ldots, 0\}$ which shows the cancelling of "a" rows in the stack when represented as a matrix. The process of filling here shows the first step as the simple filling of 1's from left to right and the cancelling can be made as soon as one line is filled with the same values (a line filled with the same values "a" is equivalent to a line of zeros and is equivalent to the removal of this line in the memory which acts as a clearing process to maintain a bounded memory size). In addition, bitstream input V[k] may be leading to the following repartition of the Vi[k]: $\{V1[k], \ldots, Vb[k], Vb+1[k], \ldots, Vm[k]\}=\{a+1, \ldots, a+1, a, \ldots, a\}$. One can simply verify that $\Sigma_{i=1}^{m} Vi[k]=V[k]$ (=V in this exemplary case).

This filling process is further explained in FIG. 8 with an empty stack at 802 and a given m and V[k] combination (m=6, V[k]=10). In this figure, the repartition of the Vi[k] is obtained through the filling at 804 and the next memory stack state is derived after proper reduction of the stack by cancelling the equal rows at 806 so that only the non-linearity remainders are left integrated in the final stack state before processing the next sample. Here V[k]=10=1*6+4 so one line is filled with 1's and the top line is filled with {0,1,1,1,0,4}. The bottom line is then cancelled, and the remaining state at the end of the filling process is $S_1[k]=\{1,1,1,1,0,0\}$. The zeros at V5[k] and V6[k] are called gaps and these gaps will be filled in priority for the next filling process. The obtained repartition of the bitstream is $V[k]=\{V1[k], \ldots, V6[k]\}=\{2,2,2,2,1,1\}$ so it verifies $\Sigma_{i=1}^{m} Vi[k]=V[k]$. The algorithm will then for the next sample place the input bitstream repartition as calculated at each input unit-DAC and proceed with the sampling and charge transfer.

A non-empty stack will have one or more rows where there are both ones and zeros (when adopting a positive-only representation). These rows will not be cancelled since not all $S_{1,i}[k]$ have the same value at each i. The algorithm should fill in priority the zeros at the most bottom row of the stack until the corresponding rows are totally filled and then cancelled. The gaps are by definition the zeros remaining to be filled in such rows. These gaps correspond to remainders of the non-linearity of the DAC to correct during next samples and the most bottom rows correspond to the oldest non-linearity error remainders so they have to be cancelled as early as possible.

Starting with a non-empty stack, for a positive bitstream value V[k], the filling process is essentially the same as the filling starting with an empty stack, except that it fills in priority the bottom rows of the stack to fill the gaps and cancel their corresponding rows. This priority is explained in FIG. 9 wherein the filling is realized on an example with a non-empty stack and the same combination of bitstream and m value than on FIG. 8.

Figure 9:
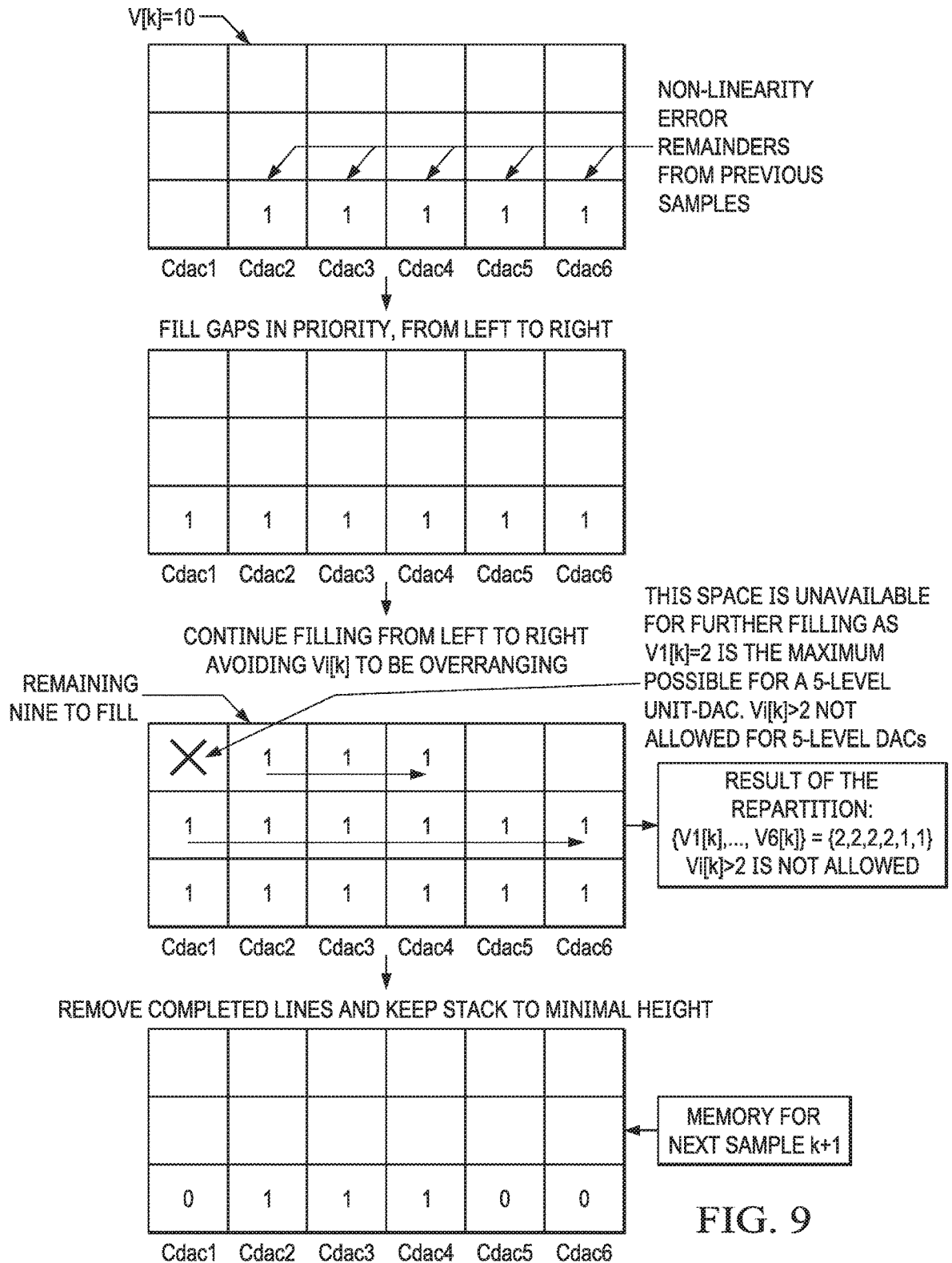
FIG. 9 is an illustration of an example of stack-filling using a positive V and a non-empty stack, according to embodiments of the present disclosure.

FIG. 9 is an illustration of an example of stack-filling using a positive V and a non-empty stack, according to embodiments of the present disclosure. The process of FIG. 9 may illustrate an example implementation of step 740 of FIG. 7.

In FIG. 9, at 902 the stack memory starts with gaps to be filled at positions 2, 5 and 6. The stack state is $S_1[k]=\{1,0,1,1,0,0\}$. This stack position is the one after the shuffling step in the algorithm which explains how gaps can be spread out through any stack position. The bitstream is similar to the one in FIG. 8: V[k]=10. In this case, at 904 the repartition will first fill the gaps in the $S_1$ stack, at positions 2, 5, and 6. This will lead to a stack bottom row filled with 1's (so equivalent to an empty row or no row). Then when the state is reached where no more rows have any more remaining gaps, at 906 the filling returns to the process described at FIG. 8—i.e., filling an empty stack with the remaining bitstream value. In FIG. 9, the bottom row is first filled with three 1's at positions 2, 5 and 6 which leaves the process with V'[k]=V[k]−3=7 to be filled as-if the stack was empty. This leads to a final state at 908 of the stack of $S_1[k]=\{1,0,0,0,0,0\}$. And the final bitstream repartition of $\{V1[k], \ldots V6[k]\}=\{2,2,1,1,2,2\}$ which also meets the condition $\Sigma_{i=1}^{m} Vi[k]=V[k]$ as desired.

FIGS. 10A and 10B are an illustration of an example of stack-filling using a positive V wherein there are limitations of where values may be placed due to unit-DAC max values, according to embodiments of the present disclosure. The process of FIG. 10 may illustrate an example implementation of step 740 of FIG. 7.

In FIG. 10, the filling process is detailed with a specific case where the repartition is conditioned by the fact that the bitstream of one of the unit-DACs has attained its possible maximum (in the example, the bitstream input of each unit-DAC is limited to +/−2 as all unit-DAC are 5-level DACs). When this limit is attained on one of the m unit-DACs, the repartition is then limited to the remaining m−1 unit-DACs and proceeds the same way as if the number of unit-DACs was momentarily reduced to m−1. The order of the filling and the general rules of filling first the gaps are not affected by this limitation. In FIG. 10, the same case of FIGS. 8 and 9 is presented (m=6, V[k]=10), but with again a different stack state to start with the filling process. At 1002, the stack state is $\{0,1,1,1,1,1\}$. At 1004, the filling process fills the gaps first, so the first row is fully filled with ones, and then at 1006 the next rows are filled as if the stack was empty. If this filling process happened without bitstream maximum limitation at each unit-DAC, the repartition would give $\{V1[k], \ldots, V6[k]\}=\{3,2,2,1,1,1\}$ and the stack final state after cancelling lines would be $\{S_{1,1}[k], \ldots, S_{1,6}[k]\}=\{1,1,1,0,0,0\}$. However, at 1006, in the third row, the unit-DAC no. 1 (at most left column) already reached its maximum being equal to 2. In such a situation, the filling process leaves a gap at position 1 (where the "X" mark is positioned at 1006) and continues the filling at position 2. This leads to a final repartition that is slightly different than if there was no maximum limitation on each unit-DAC input value: $\{V1[k], \ldots, V6[k]\}=\{2,2,2,2,1,1\}$ where all Vi[k] are within the unit-DAC boundaries (in this case +/−2) and still satisfy $\Sigma_{i=1}^{m} Vi[k]=V[k]$ as desired. In this specific case, the final stack state at 1008 is also modified to $\{S_{1,1}[k], \ldots, S_{1,6}[k]\}=\{0,1,1,1,0,0\}$ where the gap positions are different. The bitstream maximum limitation does not fundamentally change the filling process but induces more constraints and may lead in certain cases to different repartition as this limitation is treated in priority during the filling process (from left to right) and as a hard constraint that cannot be avoided. The repartition may then not be optimum compared to a repartition that would not take in account this limitation. As a result, using unit-DACs with a higher resolution (number of possible levels) may result in less constraints and an overall better repartition which would cancel non-linearities faster.

Figure 11A:
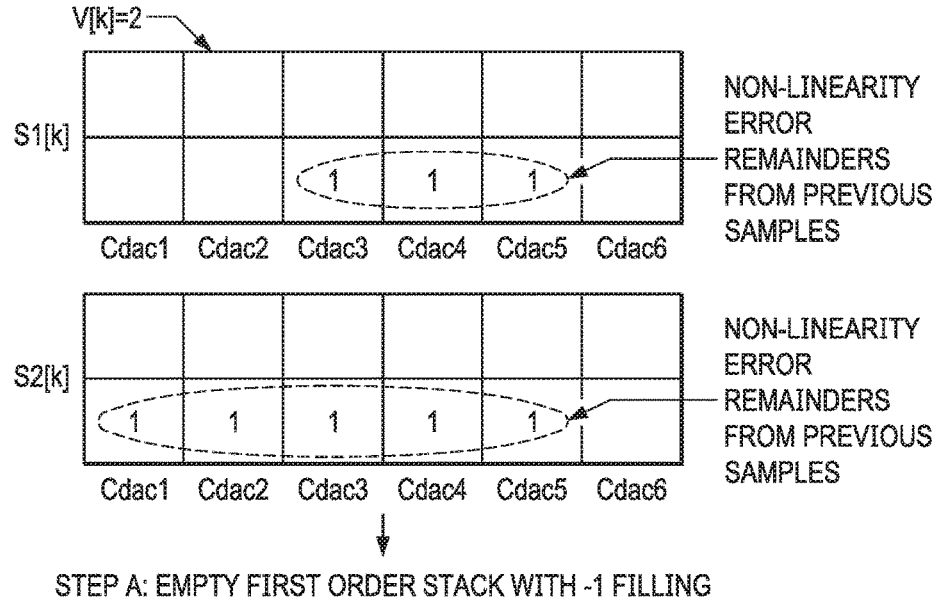
FIGS. 11A and 11B are an illustration of an example of stack-filling using a negative V and a non-empty stack, according to embodiments of the present disclosure.
Figure 11A:
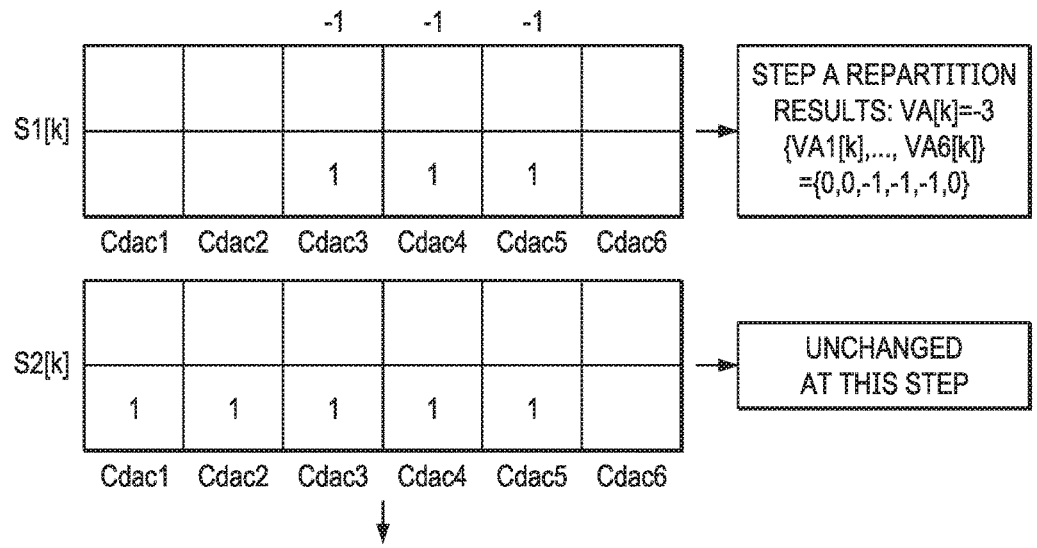
Figure 11A:
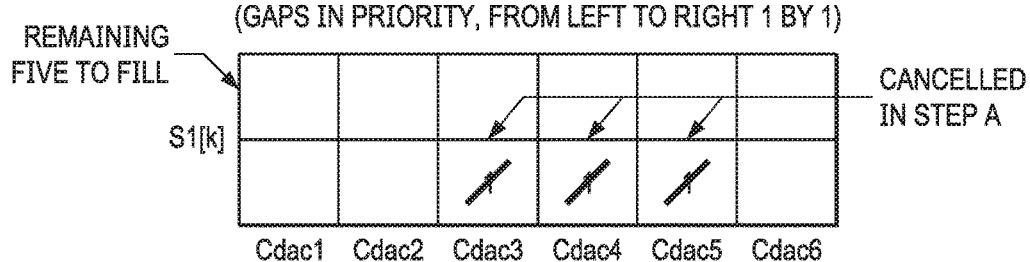
Figure 11B:
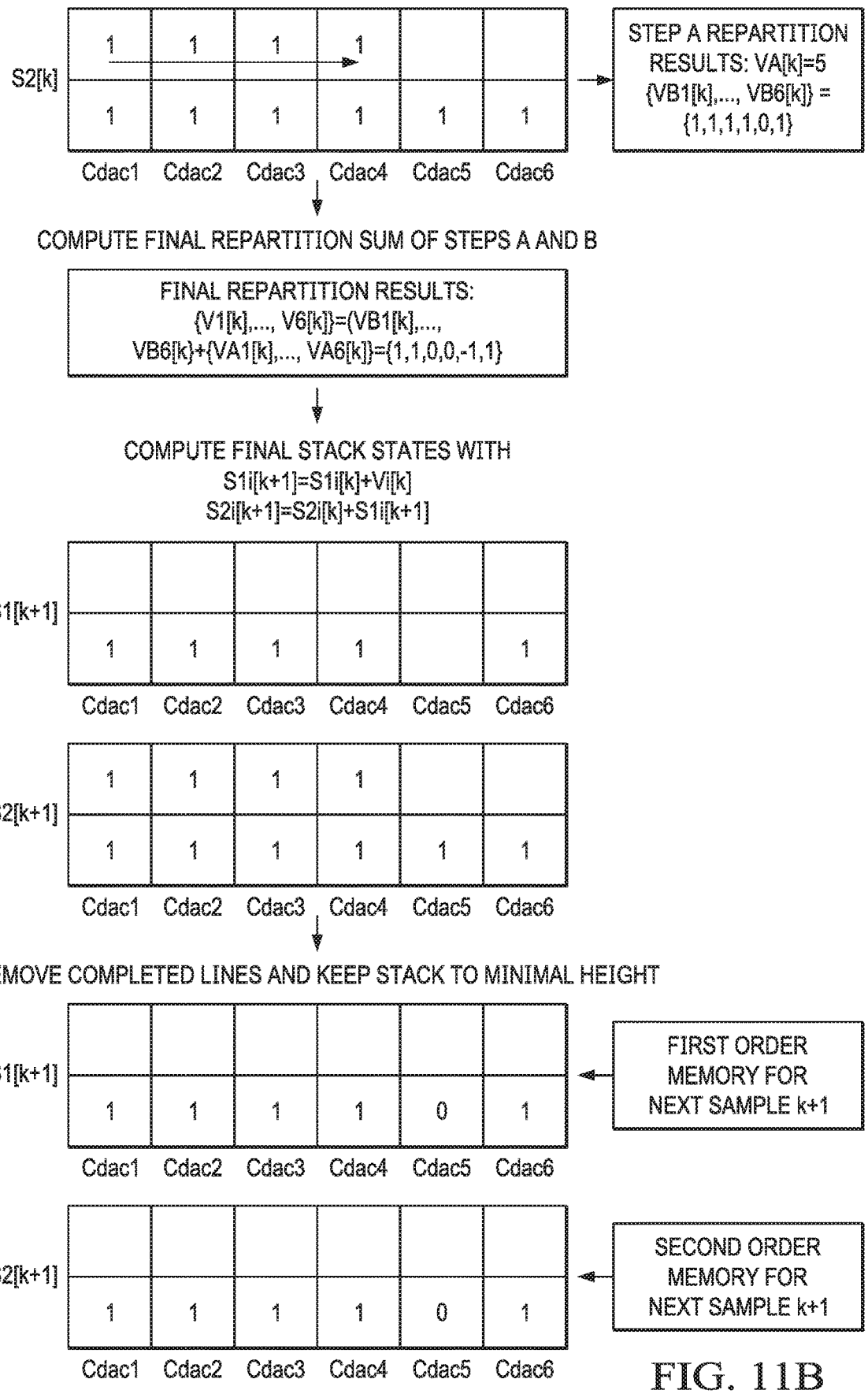

FIGS. 11A and 11B are an illustration of an example of stack-filling using a negative V and a non-empty stack, according to embodiments of the present disclosure. The process of FIG. 11 may illustrate an example implementation of step 740 of FIG. 7. In FIG. 11, the filling may be different than other filling techniques as the bitstream V[k] is a negative number. The filling process is essentially kept the same, but in this case, the gaps to fill are now considered to be the 1's instead of the 0's. The filling is now filling the gaps in priority as in FIGS. 9 and 10 but the 1's are now filled with −1's. The filling acts the same way than with a positive value bitstream, but with a dual approach (−1's are now filled until V[k] is reached, and gaps are the remaining ones). In the specific example of FIG. 11, the bitstream is V[k]=−10, with m=6 and the stack state is $\{S_{1,1}[k], \ldots, S_{1,6}[k]\}=\{0,1,1,1,0,0\}$ at 1102. The filling process first fills the gaps and clears the 1's in positions 2, 3 and 4 at 1104. Afterwards, −7 still remains at 1106 to be dispatched. The filling procedure as if the stack was empty may be used. This leaves to the repartition: $\{V1[k], \ldots, V6[k]\}=\{-2,-2,-2,-2,1,1\}$ that satisfies $\Sigma_{i=1}^{m} Vi[k]=V[k]$ as desired. The stack state then becomes $\{S_{1,1}[k], \ldots, S_{1,6}[k]\}=\{-1,0,0,0,0,0\}$ at 1108. A last step at 1110 can then be put in place to have only positive values in the stack. +1 is added to the remaining row which leads to an equivalent state of $\{S_{1,1}[k], \ldots, S_{1,6}[k]\}=\{0,1,1,1,1,1,1\}$. This final step is necessary to keep a positive-only integer memory representation but is not changing the repartition obtained previously.

As seen in FIG. 11, a negative number bitstream is essentially processed with a dual approach rather than a positive bitstream. The final state of the stack may, at each sample, be reprocessed to obtain only positive integers representation without changing the non-linearity of remainders or the given repartition. This process can be performed by adding the same positive value to any row of the stack (to all columns) until all elements of each row are a positive integer. This process may be using combinatorial logic using modulo properties. Implementation can use modulo properties to lead to easier calculations to leave all stack values always positive for a more intuitive processing, understanding and debugging.

Returning to FIG. 7, when the filling process of 740 is finished, as detailed in FIGS. 8-11 and their descriptions above, at 745 the obtained repartition array $\{V1[k] \ldots Vm[k]\}$ may be stored to be processed by the unit-DACs in the next sample. At 750, the repartition $\{V1[k], \ldots, Vm[k]\}$ obtained throughout the filling process may be placed at the inputs of each corresponding unit-DAC to be processed for the next sample. At 755, the stack memory is updated so that for each (i∈[1,m]), the following equation is verified: $S_{1,i}[k]=S_{1,i}[k-1]+Vi[k]$. Then the line cancellation process may take place to reduce memory size and to obtain a positive only stack representation. This final representation is then ready to be used for the next sample as the base for the new filling process. Algorithm 700 may return to 715, wherein the sample number may be increased to k+1.

At a first order of operation, with any such filling of a stack from left to right one by one, wherein filling is started by filling the positions that are showing zeros in the stack, and for any incoming bitstream, it can be demonstrated that the stack can be limited to a max value of 1 if cancelling of full lines occurs immediately as soon as the lines are full. That is, every time that and as soon as a line of the stack is full of 1's, −1's, or 0's, the line is cancelled. This shows that the remainder of the non-linearity is essentially cancelled and that the non-linearity will be maintained to a very low level as the remainder of the total non-linearity is only bounded to 1 for each column. This filling algorithm also attempts to fill the stack uniformly across all i as soon as possible. This property can limit the size of the stack for a first order algorithm to simply m bits where m is the number of unit DACs.

The filling algorithm can be sequential (for example the one-by-one filling would happen at each clock cycle). However, this might require a very fast clock since the algorithm should be processed in between charge transfers typically in a very short amount of time corresponding to the non-overlapping delay allowed between phases of the converter clock. The filling algorithm may be purely combinatorial, using one logic equation to compute the best possible filling for the stack to try to make it uniform based on the input V and the previous stack memory state. The output result is then the array $\{V1[k], \ldots, Vm[k]\}$ and the future state of the memory $S_1[k+1]$ resulting from the process of adding $S_1[k]+Vi[k]$ and cancelling full stack lines so that the stack total value is bounded between 0 and 1 for each column of the stack. The algorithm may give a proper non-linearity cancellation at each sample to the first order. The algorithm might not require in its implementation any static power consumption. The stacks and arrays may be represented with registers and limited to 1-bit per unit-DAC for the $1^{st}$ order stack $S_1$ and to log 2(nlev) bits per unit-DAC for the V array if nlev is the number of levels of each multi-bit unit-DAC.

Further simplifications of the algorithm can also be made, for example, such as when minimum or maximum value bitstreams can be managed in a simpler fashion. When such a bitstream V[k] happens, the repartition can already be generated without going through the filling process. In this case each Vi[k] will show a minimum or maximum value, regardless of the stack state. In this case of maximum or minimum bitstream values, the repartition has only one possible choice which renders the algorithm easy to process. For example, in a case where the unit-DACs are 5-level DACs, each unit-DAC input value is bounded between −2 and +2. If V[k]=2*m, the repartition will automatically be $\{V1[k], \ldots, Vm[k]\}=\{2, \ldots, 2\}$. Since the repartition is having the same values for each Vi[k], the memory stack $S_1$ will not be changed by the filling process as adding an integer value to each column is equivalent to hold same values. Therefore, in this specific case, both the repartition and the memory stack new values can be predetermined easily: $S_1[k+1]=S_1[k]=\{S_{1,1}[k], \ldots, S_{1,m}[k]\}$. The filling algorithm may be DEM-type algorithm as it is a function of the current bitstream and the previous memory stack and it tries to render the stack globally uniform for each sample as soon as possible without limitation of the bitstream values and without having different memories in function of the bitstream value. The filling algorithm may result in a dither effect by randomizing the DAC response and decorrelating it from the input. This may improve the spurious-free dynamic range (SFDR) of the resulting ADC system. Further dithering effect can be obtained by randomizing the order of the filling when starting with empty stacks as explained previously.

When a first order algorithm is applied to a converter having two integrators in series in the sigma delta loop, this may result in unexpected non-linearity remainders at the output of the second integrator. The first integrator output will show non-linearities properly cancelled (or maintained at a low-level at all times), but there is no guarantee that this will result in an optimum management and cancellation of the non-linearities after a second integration. Therefore, there may be a need for a second order algorithm, the goal of which may be to maintain the non-linearity remainders as small as possible for both the outputs at the first and second integrators.

At a second order algorithm such as applied in FIG. 5, the array representations defined for the first order may be kept for the bitstream V[k], its repartition through the unit-DAC s $\{V1[k], \ldots, Vm[k]\}$ and the first order memory stack $S_1[k]=\{S_{1,1}[k], \ldots, S_{1,m}[k]\}$. Additionally, a second order stack $S_2[k]$ may represent the remainder of the non-idealities at a second order at each sample k. This second stack may be the sum of the sum of the non-idealities remainders transferred to the sigma delta loop. The second stack 606 may be denoted as an array of m integers, $S_2[k]=\{S_{2,1}[k], \ldots, S_{2,m}[k]\}$ as shown in FIG. 6. The goal of the second order algorithm may be to fill the bitstream among the unit-DACs (accomplished by splitting V[k] into the repartition array $\{V1[k], \ldots, Vm[k]\}$ with the same constraint $\Sigma_{i=1}^m Vi[k]=V[k]$) so that both the first and second order stacks are cancelled at the same time while the desired bitstream is correctly processed. In one embodiment, cancellation of the first order stack may be a priority. The second order algorithm may use the same principles for the filling values as was used in the first order algorithms. Since the filling on the first order depends on both bitstream and first order previous stack state, the second order also depends on these two elements—in addition to the previous second order stack state.

Figure 12:
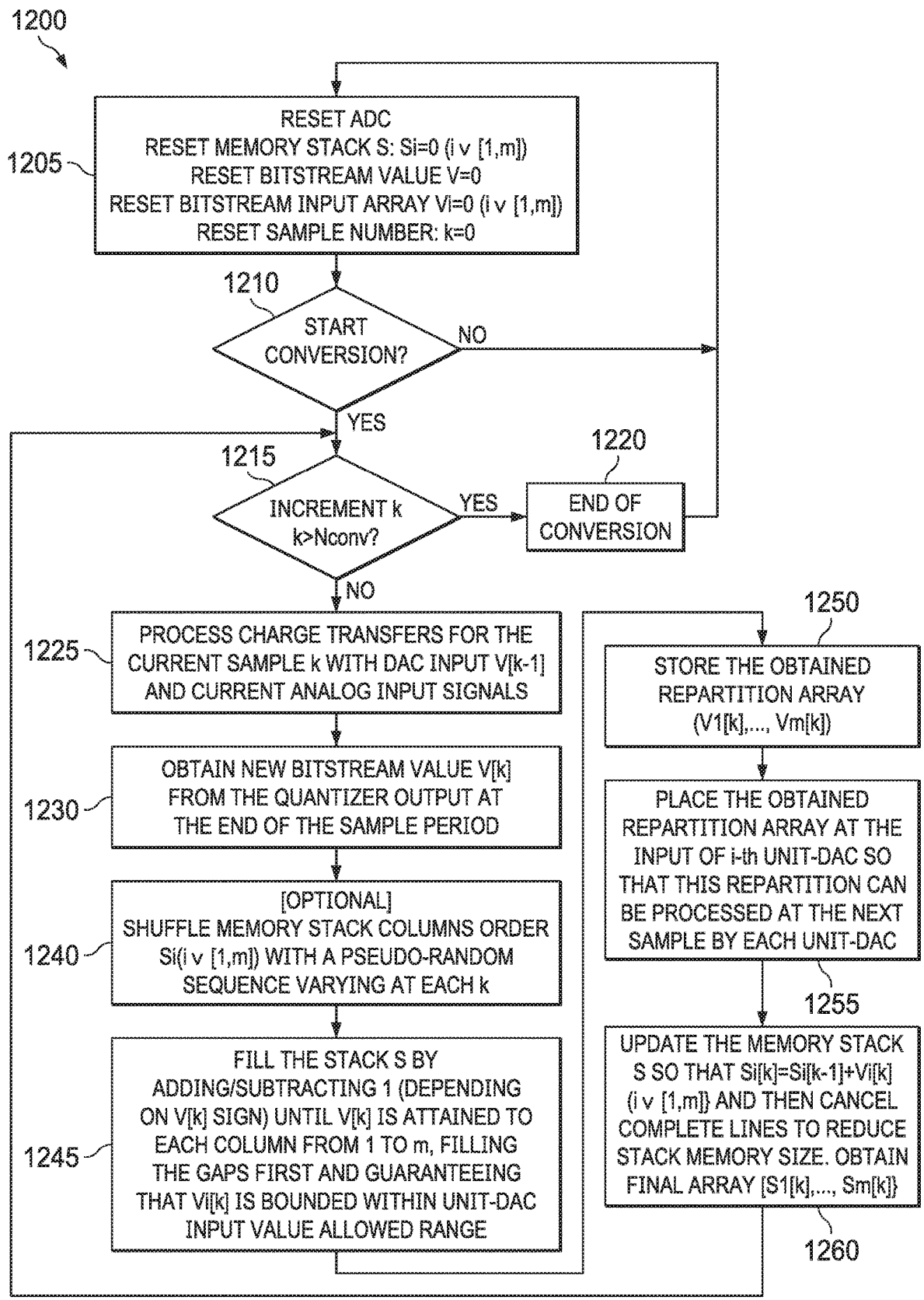
FIG. 12 illustrates a second order algorithm, according to embodiments of the present disclosure.

FIG. 12 illustrates a second order algorithm 1200, according to embodiments of the present disclosure. FIG. 12 illustrates the second order DWA algorithm to cancel or diminish the non-linearity induced by the mismatch in the DAC composed with m unit-DACs in parallel that show mismatch after both first and second order integrations. Algorithm 1200 may represent operation of any of the elements of FIGS. 1-6. Algorithm 1200 may include any suitable number of steps. Steps shown in algorithm 1200 may be omitted, repeated, performed in parallel with one another, performed recursively, or route to other steps of algorithm 1200 in any suitable order. Algorithm 1200 may include more or fewer steps than illustrated in FIG. 12.

At 1205, all stack and bitstream values may be reset to zero, just as is performed in the first order algorithm 700 as shown in FIG. 7. The value k, representing the sample number, may be reset to zero. Algorithm 1200 may proceed to 1210.

At 1210, it may be determined whether sigma-delta conversion of analog input values is to be performed. Such a determination may be based on a start conversion digital trigger signal coming from the digital portion of the circuit. If conversion is to be performed, algorithm 1200 may proceed to 1215. Otherwise, algorithm 1200 may return to 1205.

At 1215, when the conversion process of algorithm 700 is running, the k value or the sample count may be incremented. It may be determined whether k has reached or exceeded a specified number of samples. If so, algorithm 1200 may proceed to 1220. Otherwise, algorithm 1200 may proceed to 1225.

At 1220, the conversion process may end. Algorithm 1200 may proceed to 1205.

At 1225, at each sample k, the sigma delta loop may proceed with charge transfers for the current sample k, using DAC input of the previous value of the bitstream V[k−1] and the current analog input signals. The conversion takes place and at 1230 the delta-sigma charge transfers in the analog domain lead to have a new output V[k] of the quantizer at the end of the sample k. At 1235, similar to the first order algorithm, before each filling process takes place, the columns of the stacks can be shuffled with a random or pseudo-random sequence clocked on the sample count in order to act as a dither and possibly improve the SFDR and reduce idle tones at the output of the device. This reshuffle of the columns of the stacks should be performed in a similar manner on each stack $S_1$ and $S_2$. As the columns represent a defined unit-DAC, each column of the stack $S_1$ corresponds to the same column on stack $S_2$ representing the same unit-DAC. $S_1$ represents the non-linearity remainder at the output of one integrator. $S_2$ represents the non-linearity remainder at the output of two integrators, both in the same unit-DAC. The pseudo-random sequence should apply to both stacks at the same time with the same effects.

The second order algorithm 1200 may differ from the first order algorithm 700, but may share the same principles of filling stack values, such as filling slots in a rising order for a positive integration. The values of the second stack can be equivalently represented with all positive integers. The principle of filling with a negative bitstream may also be used. The constraints of the maximum possible value for each unit-DAC in the repartition is also applicable as it is intrinsic to the structure of each unit-DAC.

The filling of second order algorithm 1200 may include two phases. In the first filling phase in 1240, stack $S_1$ may be emptied via calculation of and use of a filling combination. The filling combination may empty or completely cancel the first stack, regardless of the bitstream value. This may lead to a given filling of a repartition of {VA1[k], . . . , VAm[k]}. However, the necessary condition that $\Sigma_{i=1}^{m}$ VAi[k]=V[k] might not be reached since this filling is a function of the first order stack state, and not of the bitstream. If the first order stack state is using positive-only representation, VAi(k)=−$S_{1,1}$(k) may be true for each i. By definition, $\Sigma_{i=1}^{m}$ VAi[k]=VA[k], and VB[k] is defined as VB[k]=V[k]−VA[k]. After the first phase, the repartition {VA1(k) . . . VAm(k)} is obtained but the bitstream has not yet been correctly processed. Furthermore, there is a remainder VB[k] to distribute among the different unit-DACs. VB[k] can be bigger or lower in value than V[k] depending on the relative first stack state filling and bitstream current value. Step 1240 facilitates discarding the first-order integration to handle the second-order stack as-if it was only a first order stack, and therefore treated as-such by applying a first order algorithm to it.

In 1245, in the second phase, the second order stack may be filled as-if it was a first order stack with a first order filling algorithm. The first order filling algorithm may be the same algorithm used in 1240, but instead setting the second order stack as the stack to be filled and setting the bitstream as VB[k] obtained from 1240. All other first order mechanisms from step 1240 may apply to step 1245. After this filling is calculated, an associated repartition array {VB1[k], . . . , VBm[k]} may be obtained. Regarding a bitstream maximum limitation per unit-DAC, such as bitstream limitation should be applied to the sum of the two values VBi[k]+VAi[k] instead of just VBi[k] for each i. This limitation correctly bounds the bitstream at the input of each unit-DAC. The resulting overall filling for the second order algorithm may then be {V1[k], . . . , Vm[k]} where for each i the equation Vi[k]=VAi[k]+VBi[k] is verified. Furthermore, $\Sigma_{i=1}^{m}$ Vi[k]=V[k] still applies within the context of 1245.

Thus, in 1240 the first order stack may be cancelled and the bitstream may be modified. Then, in 1245 the filling of the second order stack may be processed just like a first order filling as in algorithm 700, but using the modified bitstream. The sum of the two fillings may be added to get the final repartition of the bitstream among the different unit-DACs.

In one embodiment, the two phases may be merged within the same computation engine and lead to purely combinatorial logic equations and calculations, the repartition would be immediately calculated based on the two stack states and the bitstream at any given sample k. The two phases are described separately to fully illustrate algorithm 1200, but the two phases can be merged into a single phase performed by a single computation engine without any limitation. In another embodiment, the two phases can be kept as separate phases, wherein the phases are addressed and computed serially or in parallel. The two phases do not necessarily require two timing phases, and thus can be processed in parallel within the same event or edge when a new bitstream input is available. Algorithm 1200 may be implemented serially or in combinatorial logic depending on the timing constraint of each design and depending on the die size constraints associated.

At 1250, at the end of the second phase, the obtained repartition array can be placed at the input of each unit-DAC so that the repartition can be processed at the next sample. At 1255, the final processing of the stacks may be performed. The stack values may be recalculated using equations that describe a standard integration at a first and second order. For the first order, the following equation still applies: $S_{1,i}[k]=S_{1,i}[k-1]+Vi[k]$. For the second order, the following equation applies: $S_{2,1}[k]=S_{2,1}[k-1]+S_{1,i}[k]$. These equations may be applied for every i to obtain the final stack states $S_1[k]=\{S_{1,1}[k] \ldots S_{1,m}[k]\}$ and $S_2[k]=\{S_{2,1}[k] \ldots S_{2,m}[k]\}$. Only then, the process of cancelling the fully filled lines can take place in both stacks at the first and second order. This defines the final state of the stacks that will be used to determine the next repartition when k will be incremented.

At 1260, an overload or overflow of the second order stacks may be handled, if necessary. An overflow may arise when there is insufficient memory to successfully integrate values. An overflow may arise if the algorithm fails to converge for results that cancel out non-linearity. Depending on the bitstream and the state of the first and second order stacks at any given sample k, the filling of the second order stack may lead to unbounded stack values. This may contrast the always-bounded operations in the first order algorithm 700, wherein the number of rows of the stack memory could always be kept bounded to 1. In one embodiment, unbounded stack values may be handled by resetting the second order stack when overflow happens. In another embodiment, unbounded stack values may be handled by limiting the stack value to a maximum, akin to using the stack like a first-in-first-out data structure. The bottom row of a stack may then be dropped to be replaced by the top row, even if the bottom row has not been properly filled with same values for each i. As a result, non-compensated non-linearities may be induced that will not be recorded and will not be cancelled in the future samples. This may limit the linearity performance of the second-order algorithm and a trade-off between the die size (or the memory size) and the non-linearity performance should be optimized. The stack maximum size can be taken so that the non-idealities remainders do not exceed the non-linearity limit specifications.

When an overflow of the second order stack is about to happen, algorithm 1200 may return to using a simpler first stack filling in lieu of the two-phase process of 1240-1245. Thus, 1260 may specify that a subsequent operation of 1240-1245 may be performed instead by the simpler first order filling and only considering a first order stack to fill. The first order filling, such as described in algorithm 700, may be run in parallel with the second order filling in algorithm 1200 to enable easy switching from one to another if limit cycles appear to be frequent, or if critical timings render a sequential process unachievable. Limiting the filling to a single order may be more prone to overloading the second stack faster. However, limiting the filling to a single order may be required when input analog values are close to the full-scale maximum value allowed at the input of the delta-sigma modulator. In these cases, the second-order filling may force too many constraints to calculate the proper repartition. As a result, at 1260 algorithm 1200 can adjust priority of subsequent filling operations to ensure the desired results. These may include interventions in the otherwise defined operation of algorithm 1200. For example, an intervention may be made to maintain bounds of execution of the first order stack. If repartition calculations yield an unbounded operation in the first order stack, algorithm 1200 may switch automatically to use a simpler first order repartition operations. Limiting filling to a first order filling does not remove the necessary step of calculating the proper second order stack results of the integrations generated by the calculated repartition $\{V1[k], \ldots, Vm[k]\}$ before managing the overflow by an eventual specific strategy (reset, FIFO or any other overflow management process). However, the first order stack can be left as bounded to one row. The second order stack can be bounded to a larger number of rows depending on the allocated die size and memory elements.

Limit cycles wherein second order stack overflows are more prone to happen may correspond to large absolute value bitstreams wherein the unit-DAC repartition has a limited number of choices. This can be improved by increasing the number of levels or number of phases, or by limiting the analog input range of the ADC so that bitstreams do not show high values. Proper management of the overflow events may lead to enlarging stack value maximum on the first order stack (limited to 1 bit in first order algorithm).

Figure 13:
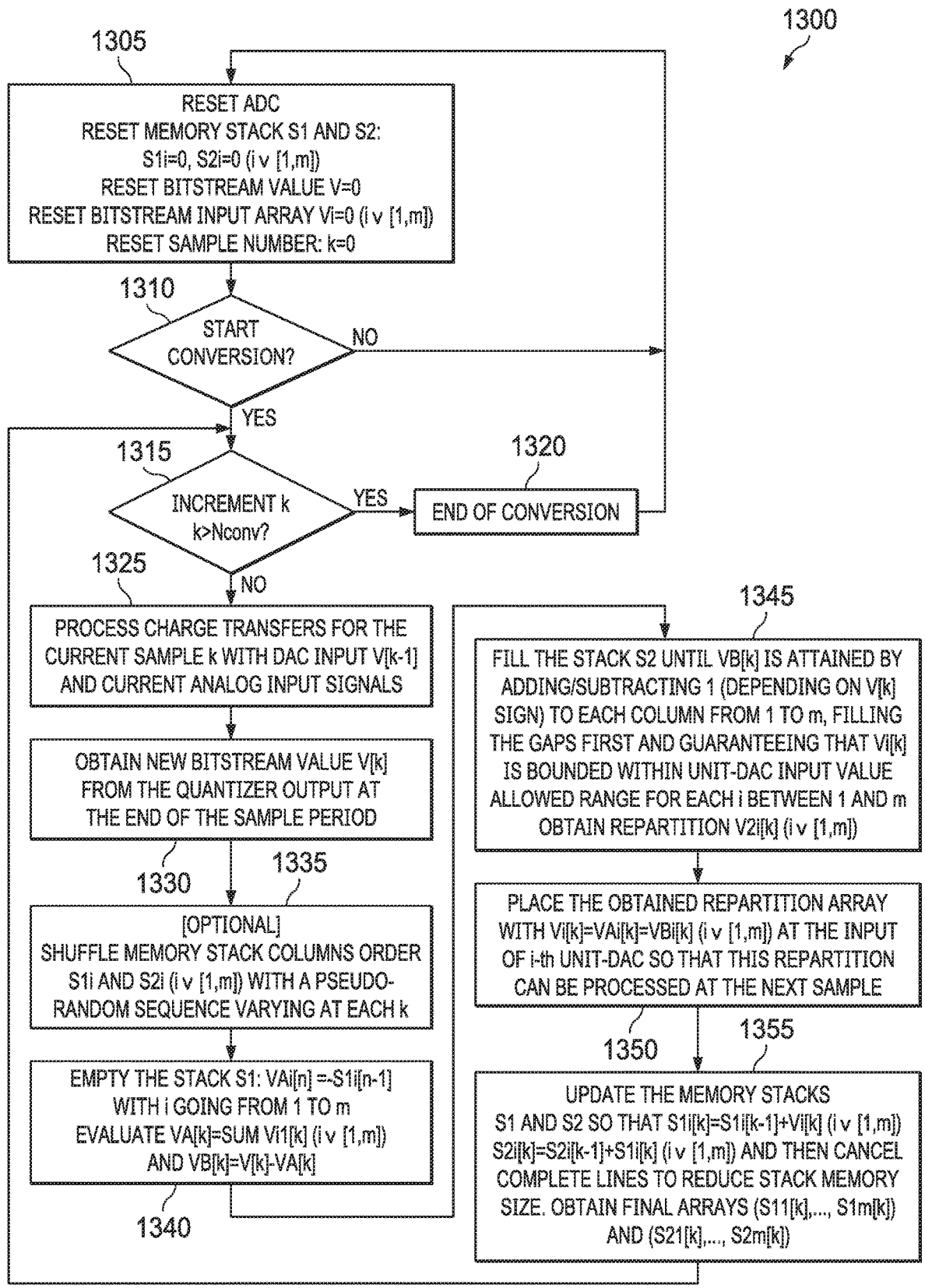
FIG. 13 illustrates example operation of second-order algorithm, according to embodiments of the present disclosure.

FIG. 13 illustrates example operation of second-order algorithm 1200, according to embodiments of the present disclosure. FIG. 13 illustrates operation with example values wherein m=6, V[k]=2 and the stack memory states are respectively $S_1[k]=\{S_{1,1}[k], \ldots, S_{1,6}[k]\}=\{0,0,1,1,1,0\}$ and $S_2[k]=\{S_{2,1}[k], \ldots, S_{2,6}[k]\}=\{1,1,1,1,1,0\}$. In this example, shuffling of the unit-DACs is not shown but may have been performed previously.

At 1302, S1[k] and S2[k] may have remainders and gaps from previous samples as shown in FIG. 13.

At 1304, the first phase may be performed. The first order stack may be emptied by applying −1 fillings. The first phase cancels the first order stack, and leads to the repartition or filling to be applied of $\{VA1[k], \ldots VA6[k]\}=\{0,0,-1,-1,-1,0\}$. VA[k] may be −3, following the rule $\Sigma_{i=1}^{m} VAi(k)=VA(k)$ VB[k]=V[k]−VA[k]=5 will be used for the bitstream and first order filling of the second order stack in the second phase. $S_2[k]$ may be unchanged at 1304.

At 1306, in the second phase the second order stack is filled with a first order filling algorithm and the bitstream VB[k]. This leads to the repartition $\{VB1[k], \ldots, VB6[k]\}=\{1,1,1,1,0,1\}$ applying the rules determined with a first order algorithm. At 1308, the final repartition is calculated to be the sum of the VA and VB repartitions: $\{V1[k], \ldots, V6[k]\}=\{1,1,0,0,-1,1\}$. This repartition satisfies the equation: $\Sigma_{i=1}^{m} Vi[k]=V[k]$. Once this repartition is obtained, at 1310 the computation of the final first and second order stacks can take place and at 1312 the cancelling of the full lines can also happen. This leads to the final stack states: $S_1[k+1]=\{S_{1,1}[k+1], \ldots, S_{1,6}[k+1]\}=\{1,1,1,1,0,1\}$ and $S_2[k+1]=\{S_{2,1}[k+1], \ldots, S_{2,6}[k+1]\}=\{1,1,1,1,0,0\}$. The bitstream repartition can be then placed at the input of each unit-DAC for the next sample to proceed and the memories of the stack can be updated so that the next sample will be processed.

Figure 14A:
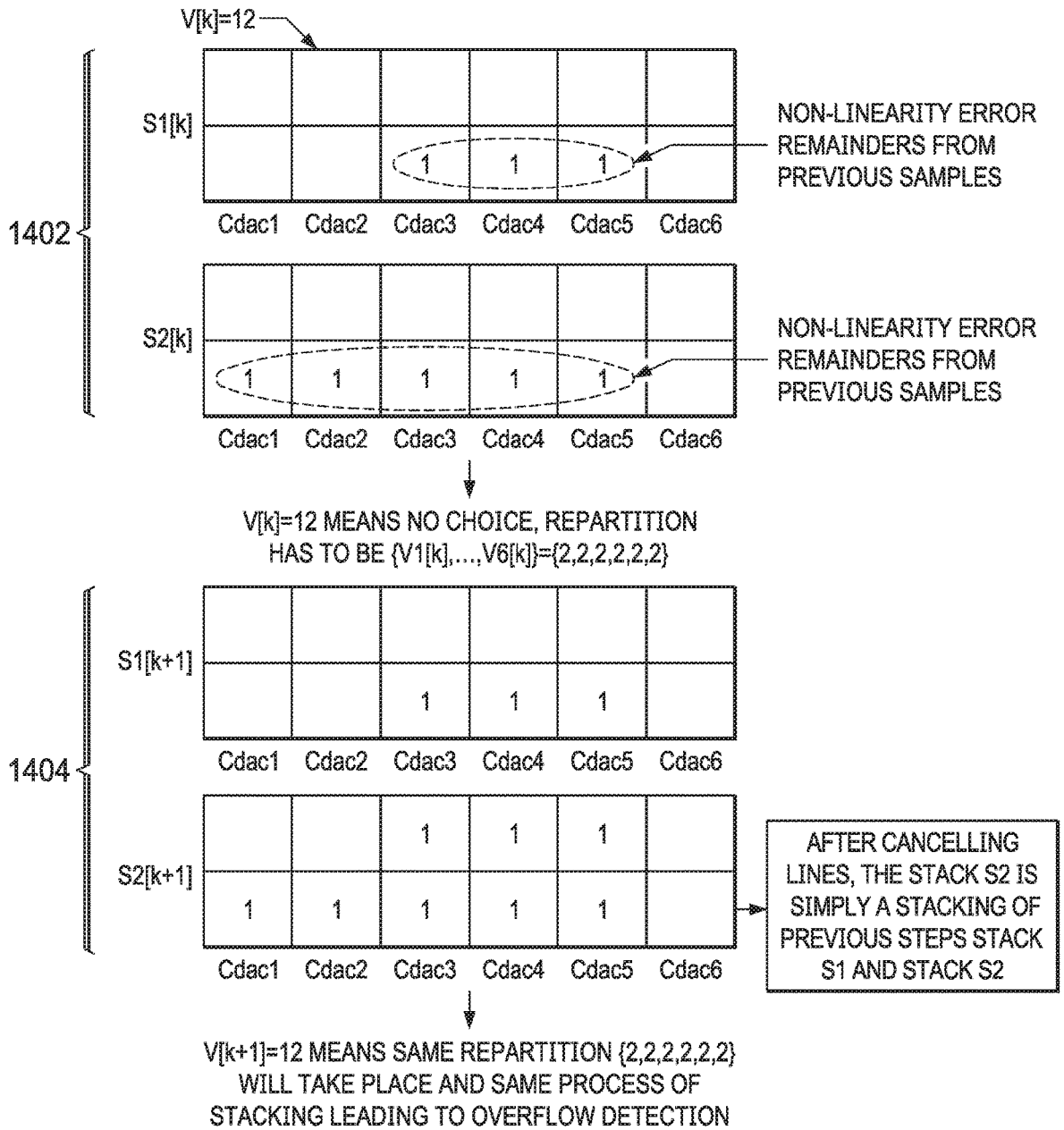
FIGS. 14A and 14B illustrate further example operation of second order algorithm, according to embodiments of the present disclosure.
Figure 14B:
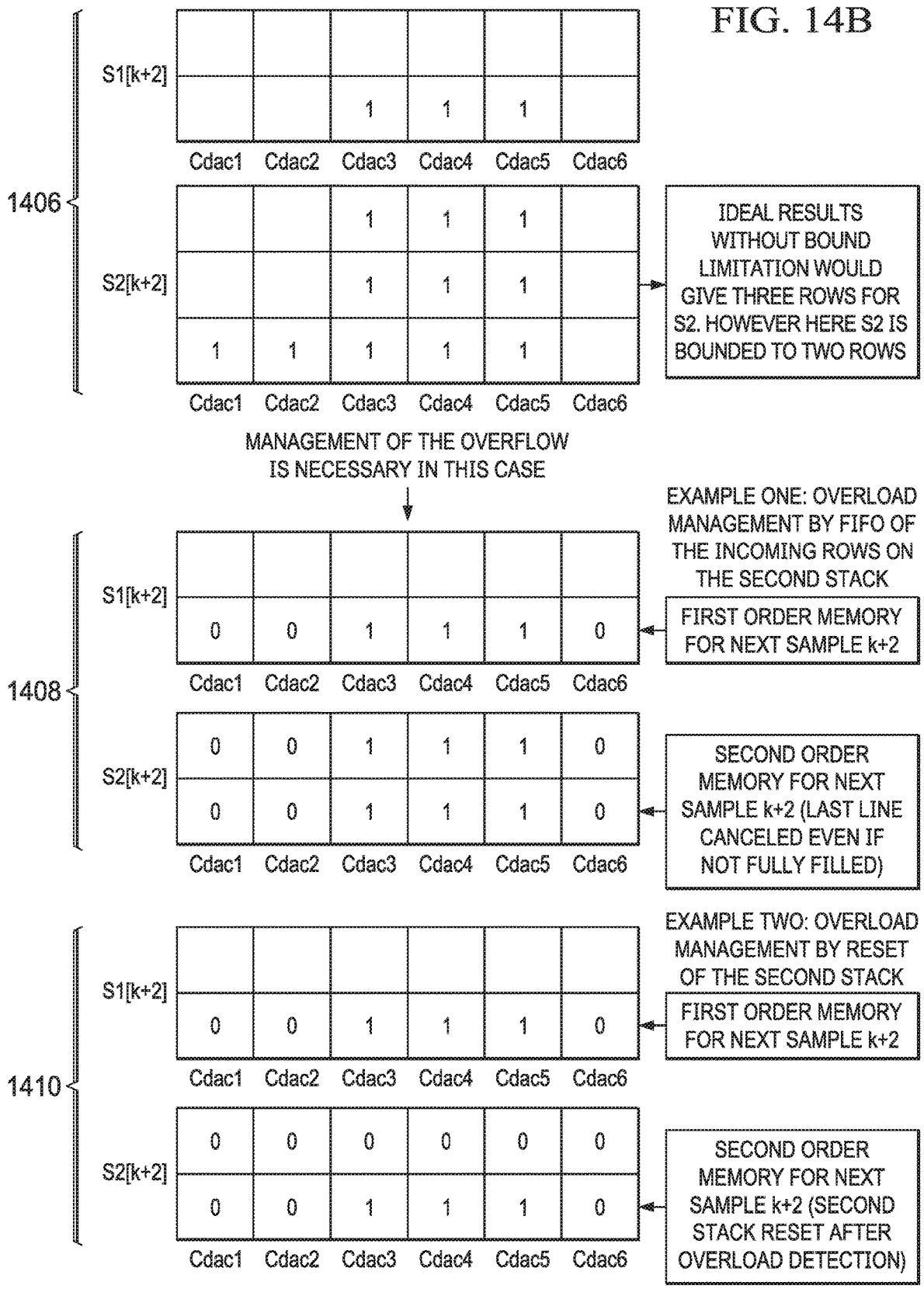

FIGS. 14A and 14B illustrate further example operation of second order algorithm 1200, according to embodiments of the present disclosure. FIG. 14 illustrates a case where an overload is detected on the second order stack. Two possible overload management strategies are depicted. The example in FIG. 14 is a specific case where m=6, V[k]=V[k+1]=12. As described previously, if the bitstream value V[k] is equal to the maximum value allowed (V[k]=2 m), the repartition is then equal to the maximum value input for each unit-DAC. Furthermore, $\{V1[k], \ldots, V6[k]\}=\{2,2,2,2,2,2\}$, regardless of the states of the first and second order stacks. In this case, the stack $S_2$ can be obtained by simply stacking $S_1$ and $S_2$ rows of the previous state, as the bitstream integration will lead to no change in the non-linearity remainders. All lines added are already full, so these are cancelled. In the example of FIG. 14, at 1402 the starting point of the stack is: $S_1[k]=\{S_{1,1}[k], \ldots, S_{1,6}[k]\}=\{0,0,1,1,1,0\}$ and $S_2[k]=\{S_{2,1}[k], \ldots, S_{2,6}[k]\}=\{1,1,1,1,1,0\}$. Then second order algorithm 1300 can be applied, wherein at 1402 the next states at sample k+1 are calculated to be equal to: $S_1[k+1]=\{S_{1,1}[k+1], \ldots, S_{1,6}[k+1]\}=\{0,0,1,1,1,0\}$ and $S_2[k+1]=\{S_{2,1}[k+1], \ldots, S_{2,6}[k+1]\}=\{1,1,2,2,2,0\}$. The stack S2 is now represented on two rows as none of these rows can be cancelled.

In the example of FIG. 14, V[k+1]=12. Accordingly, at 1406 the same repartition $\{2,2,2,2,2,2\}$ is determined and therefore the stack values for the k+2 sample are calculated to be equal to $S_1[k+2]=\{S_{1,1}[k+2], \ldots, S_{1,6}[k+2]\}=\{0,0,1,1,1,0\}$ and $S_2[k+2]=\{S_{2,1}[k+2], \ldots, S_{2,6}[k+2]\}=\{1,1,3,3,3,0\}$. However, in this example, the second order stack is bounded to a value equal to 2 rows so the maximum value of any integer element of the stack is 2. Columns 3, 4 and 5 are showing an overload. This overload detection needs proper management because the memory of the stack $S_2$ cannot hold values larger than its predefined maximum (in this case, the maximum is equal to +2).

In FIG. 14, two possible strategies for the overload management are depicted. The first strategy at 1408 is to remove the most bottom row of the stack and record and hold in the memory just the top rows. This leads to a modification of the stack S2 memory state now being reduced to: $S_2[k+2]=\{S_{2,1}[k+2], \ldots, S_{2,6}[k+2]\}=\{0,0,2,2,2,0\}$. Consequently, an integrated non-linearity at the second stage will never be finalized and thus never be cancelled. An overload may be manifested by a non-linearity remainder appearing without being cancelled or otherwise handled by the algorithm. This condition may be managed by sizing the memory of the stacks to be larger as explained previously.

The strategy at 1410 is to reset the stack completely and hold only the new stack state after the reset. This leads to the new memory state: $S_2[k+2]=\{S_{2,1}[k+2], \ldots, S_{2,6}[k+2]\}=\{0,0,1,1,1,0\}$ in the depicted example. This strategy is leading to less accurate non-linearity removal but is simpler to implement. Other strategies can be implemented to manage an overload case but they will in any case lead to an integration of a non-linearity that cannot be further managed and removed as the memory is limited on the second stack.

The algorithm may be extended to a larger order than two by adding as many stacks as the sum order. An n-th order algorithm may be constructed by implementing a similar two-phase process being of the following type: (1) cancel the stack of the N−1 first stacks; (2) obtain a first repartition, adjust bitstream; (3) fill the last N-th stack to obtain a second repartition; (4) sum the two obtained repartitions; and (5) manage eventual overloads by implementing a full reset or a FIFO on each stack when overload happens. The size of the stacks may grow exponentially with order because of the integration process, so a limited order is preferable according to the number of integrations in the analog delta-sigma loop. The cancelling of the N−1 stacks may be done in priority as it may be increasingly difficult to cancel stacks and maintain non-linearity to a small value as the number of integration rises.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

The invention claimed is:

1. A digital to analog converter (DAC), comprising:
a summing circuit;
at least two unit-DACs connected in parallel, wherein:
  each unit-DAC:
    includes a unit-DAC input;
    is configured to output an analog value proportional to its unit-DAC input in an inherently linear manner synchronous with a clock signal;
    includes a gain mismatch when compared to other unit-DACs of the DAC;
  the summing circuit is configured to sum outputs of the unit-DACs and output the sum as output of the DAC; and
  a calculation engine configured to:
    receive a plurality of successive samples of DAC input sampled according to the clock signal;
    for each sample received, partition the sample of DAC input to the unit-DACs based upon previous partitions of inputs to the unit-DACs, so that a sum of the unit DAC inputs is equal to an input of the DAC;
    using integration of a plurality of successive DAC outputs, cancel out integrated non-linearities of outputs of the DAC caused by the gain mismatches of the unit-DACs; and
    partition samples of DAC input to the unit-DACs through a recursive nth order partitioning algorithm, wherein n is greater than one, for each DAC input, including configuring the calculation engine to:
      determine a first partition of the DAC input that would cancel an (n−1)th order previously integrated non-linearity;
      compute an equivalent DAC input of the first partition of DAC input;
      add the equivalent DAC input to the DAC input to obtain a total DAC input;
      use a first order algorithm to apply the total DAC input to the inputs of the unit-DACs to cancel out an nth order previously integrated non-linearity and yield a second partition of DAC input;
      sum the first partition of DAC input and the second partition of DAC input to generate a final partition, the final partition to be used as inputs to the unit-DACs for a current sample of the DAC input; and
      based on the final partition of DAC input, compute non-linearity remainders at each order of integration.

2. The DAC of claim 1, wherein the calculation engine is further configured to cancel out non-linearity of the DAC by partitioning DAC input, in average over successive inputs, so that each unit-DAC input at each order of integration receives a same integrated value of input for each order of integration defined in the partitioning algorithm.

3. The DAC of claim 1, wherein:
the analog values to be output by each unit-DAC include a charge to be transferred, proportional to its unit-DAC input; and
the output of the DAC is equal to a sum of charge transferred by the unit-DACs.

4. The DAC of claim 1, wherein the calculation engine is further configured to:
during a partitioning algorithm to cancel out non-linearity of the DAC by integrating non-linearity to an nth order, determine a failure of results to converge;
upon determining the failure of results to converge, perform another partitioning algorithm to cancel out non-linearity of the DAC by integrating non-linearity to an order lower than the nth-order.

5. The DAC of claim 4, wherein the calculation engine is further configured to, after performing the other algorithm to cancel out non-linearity of the DAC by integrating non-linearity to the order lower than the nth-order, reuse the algorithm to cancel out non-linearity of the DAC by integrating non-linearity to the nth order.

6. The DAC of claim 1, wherein the calculation engine is further configured to
define an order of partitioning, wherein unit-DACs are assigned input from the DAC input with a priority according to the defined order.

7. The DAC of claim 6, wherein the calculation engine is further configured to, between successive partitions of DAC input to the unit-DACs, shuffle the defined order, the shuffling configured to break periodicity of output of the DAC.

8. The DAC of claim 6, wherein:
the calculation engine is further configured to access a memory for each order of integration to be used by partitioning algorithms;
each memory includes a two-dimensional array of memory locations;
each column of each two-dimensional array is configured to represent each unit-DAC; and
at each order of integration, each row of the two-dimensional array is configured to represent an integrated value of the unit-DAC inputs at the order of integration or a representation of the non-linearity remainder of each unit-DAC outputs integrated at the order of integration.

9. The DAC of claim 8, wherein for a first order of integration of non-linearity, the two-dimensional array of memory locations may be configured to represent a given unit-DAC input with a single bit per column.

10. The DAC of claim 8, wherein the calculation engine is further configured to:
  determine that attempts to provide the same integrated value for each unit-DAC input for a given order of integration with a partitioning algorithm will not succeed and lead to a memory overflow;
  based on the determination that the attempts will not succeed, resetting one or more rows of the two-dimensional array representing the given order of integration non-linearity remainders so that the memory overflow is removed.

11. The DAC of claim 10, wherein the calculation engine is further configured to:
  determine that attempts to provide the same integrated value for each unit-DAC input for a given order of integration will not succeed with an nth-order partitioning algorithm; and
  perform an (n−1)th order partitioning algorithm to provide a cancellation of the non-linear remainders at the order (n−1).

12. The DAC of claim 8, wherein:
  a given input for the DAC is configured to be expressed in an input count, wherein individual elements of the input count represents a value to be converted by a given unit-DAC and element of the input count is assigned to a given unit-DAC; and
  the calculation engine is configured to partition samples of DAC input to the unit-DACs to assign input to unit-DACs by:
    successively filling, according to the defined order of partitioning, memory locations of one of the two-dimensional arrays with an element of the input count until all elements of the input count are assigned to memory locations;
    wherein the filling made to the memory locations of the one of the two-dimensional arrays is summed by column to an empty one-dimensional array to obtain a partition of the DAC input to unit-DACs;
    wherein the filling is configured to cancel non-linearity remainders in the two-dimensional arrays.

13. The DAC of claim 12, wherein the calculation engine is configured to perform the filling in a one-by-one sequential order manner.

14. The DAC of claim 12, wherein the calculation engine is configured to perform filling of subsequent orders of integration by summing remainders of non-linearity based upon partitioning and the current state of the two-dimensional arrays.

15. The DAC of claim 12, wherein the calculation engine is further configured to:
  determine a maximum input range for an individual unit-DAC for a given DAC input;
  determine whether a column for the individual unit-DAC has been filed with elements of the input count for the given DAC input so as to reach the maximum input range; and
  based on a determination that the column has reached the maximum input range for the given DAC input, omitting further filling of the column for the given DAC input.

16. The DAC of claim 12, wherein the calculation engine is further configured to fill unfilled bottom rows of the two-dimensional arrays before filling other rows of the two-dimensional arrays.

17. The DAC of claim 12, wherein the calculation engine is further configured to:
  determine whether a given column of the two-dimensional arrays are filled to capacity during a given DAC input; and
  based upon the determination that the given column is filled to capacity, omitting further filling of the column for the given DAC input.

18. The DAC of claim 12, wherein the calculation engine is further configured to, upon attempting to fill a memory location in a given column of the two-dimensional arrays, determine whether the given column has been prevented from accepting further filling with elements.

19. The DAC of claim 12, wherein the calculation engine is further configured to, after filling the memory locations of the two-dimensional arrays with a given DAC input, clearing completely filled rows of the two-dimensional arrays.

20. A method, comprising:
  accessing at least two unit-DACs connected in parallel, wherein each unit-DAC:
    includes a unit-DAC input;
    is configured to output an analog value proportional to its unit-DAC input in an inherently linear manner synchronous with a clock signal; and
    includes a gain mismatch when compared to other unit-DACs of the DAC;
  summing outputs of the unit-DACs and output the sum as output of the DAC;
  receiving a plurality of successive samples of DAC input sampled according to the clock signal;
  for each sample received, partitioning the sample of DAC input to the unit-DACs based upon previous partitions of inputs to the unit-DACs, so that a sum of the unit DAC inputs is equal to an input of the DAC;
  using integration of a plurality of successive DAC outputs, cancelling out integrated non-linearities of outputs of the DAC caused by the gain mismatches of the unit-DACs; and
  partitioning samples of DAC input to the unit-DACs through a recursive nth order partitioning algorithm, wherein n is greater than one, for each DAC input, including:
    determining a first partition of the DAC input that would cancel an (n−1)th order previously integrated non-linearity;
    computing an equivalent DAC input of the first partition of DAC input;
    adding the equivalent DAC input to the DAC input to obtain a total DAC input;
    using a first order algorithm to apply the total DAC input to the inputs of the unit-DACs to cancel out an nth order previously integrated non-linearity and yield a second partition of DAC input;
    summing the first partition of DAC input and the second partition of DAC input to generate a final partition, the final partition to be used as inputs to the unit-DACs for a current sample of the DAC input; and
    based on the final partition of DAC input, computing non-linearity remainders at each order of integration.

* * * * *

UNITED STATES PATENT AND TRADEMARK OFFICE
CERTIFICATE OF CORRECTION

PATENT NO. : 10,615,821 B2
APPLICATION NO. : 16/394392
DATED : April 7, 2020
INVENTOR(S) : Vincent Quiquempoix et al.

Page 1 of 1

It is certified that error appears in the above-identified patent and that said Letters Patent is hereby corrected as shown below:

On the Title Page

Under item (12) Quipuempoix et al.
Change to: --Quiquempoix et al.--

Item (72) Line 1, should read --Quiquempoix--

Signed and Sealed this
Second Day of June, 2020

Andrei Iancu
*Director of the United States Patent and Trademark Office*